United States Patent

Matsuyama et al.

[11] Patent Number: 5,846,320
[45] Date of Patent: *Dec. 8, 1998

[54] METHOD FOR FORMING CRYSTAL AND CRYSTAL ARTICLE OBTAINED BY SAID METHOD

[75] Inventors: Jinsho Matsuyama, Nagahama; Yutaka Hirai, Hikone; Masao Ueki, Urayasu; Akira Sakai, Nagahama, all of Japan

[73] Assignee: Canon Kabushiki Kaisha, Tokyo, Japan

[ * ] Notice: The term of this patent shall not extend beyond the expiration date of Pat. No. 5,733,369.

[21] Appl. No.: 468,519

[22] Filed: Jun. 6, 1995

Related U.S. Application Data

[63] Continuation of Ser. No. 139,060, Oct. 21, 1993, abandoned, which is a continuation of Ser. No. 911,791, Jul. 10, 1992, abandoned, which is a continuation of Ser. No. 620,395, Nov. 30, 1990, abandoned, which is a continuation of Ser. No. 158,112, Feb. 16, 1988, abandoned, which is a continuation of Ser. No. 31,046, Mar. 27, 1987, abandoned.

[30] Foreign Application Priority Data

Mar. 31, 1986 [JP] Japan ................................... 61-73093
Mar. 20, 1987 [JP] Japan ................................... 62-67335

[51] Int. Cl.$^6$ .................................................. C30B 25/04
[52] U.S. Cl. .............................. 117/90; 117/95; 117/105; 427/255.1
[58] Field of Search ........................ 437/241; 427/255.1; 117/90, 95, 105

[56] References Cited

U.S. PATENT DOCUMENTS

| | | |
|---|---|---|
| 3,346,414 | 10/1967 | Ellis et al. . |
| 3,493,431 | 2/1970 | Wagner . |
| 3,580,732 | 5/1971 | Blakeslee et al. . |
| 3,620,833 | 11/1971 | Gleim et al. ............................ 117/212 |
| 3,892,608 | 7/1975 | Kuhn ..................................... 148/188 |
| 4,239,788 | 12/1980 | Beck ........................................ 427/43 |
| 4,402,771 | 9/1983 | Thomas ............................ 156/DIG. 69 |
| 4,462,847 | 7/1984 | Thompson et al. ...................... 156/612 |

(List continued on next page.)

FOREIGN PATENT DOCUMENTS

| | | |
|---|---|---|
| 0180751 | 5/1986 | European Pat. Off. . |
| 55-050636 | 4/1980 | Japan ..................................... 156/610 |
| 56-50636 | 4/1980 | Japan . |
| 56-024925 | 3/1981 | Japan ..................................... 156/610 |
| 56-24925 | 3/1981 | Japan . |
| 58-116739 | 7/1983 | Japan . |
| 58-120590 | 7/1983 | Japan . |
| 59-69495 | 4/1984 | Japan . |
| 59-169918 | 9/1984 | Japan . |
| 60-86096 | 5/1985 | Japan .............................. 156/DIG. 68 |

OTHER PUBLICATIONS

Gibbons et al., CW Laser Recrystallization of <100>Si on Amorphous Substrates, Applied Physics Letters, 34(12) Jun. 15, 1979 pp. 831–832.

Claassen et al., The Nucleation of CVD Silicon on $SiO_2$ and $Si_3N_4$ Substrates, Journal of Electrochemical Society, Jan. 1980, pp. 194–202.

Jastrzebski et al., SOI by CVD: Epitaxial Lateral Overgrowth Process Journal of Crystal Growth 63 (1983) PP. 493–526.

(List continued on next page.)

*Primary Examiner*—Robert Kunemund
*Attorney, Agent, or Firm*—Fitzpatrick, Cella, Harper & Scinto

[57] ABSTRACT

A method for forming a crystal comprises applying a crystal forming treatment on a substrate having a free surface comprising a nonnucleation surface ($S_{NDS}$) with small nucleation density and a nucleation surface ($S_{NDL}$) exposed from said nonnucleation surface having a sufficiently small area for a crystal growing only from a single nucleus and having a greater nucleation density ($ND_L$) than the nucleation density ($ND_S$) of said non-nucleation surface ($S_{NDS}$), thereby growing a single crystal from said single nucleus.

25 Claims, 15 Drawing Sheets

U.S. PATENT DOCUMENTS

| | | | |
|---|---|---|---|
| 4,473,598 | 9/1984 | Ephrath et al. | 427/94 |
| 4,490,208 | 12/1984 | Tanaka et al. | 156/614 |
| 4,522,662 | 6/1985 | Bradbury et al. | 156/613 |
| 4,637,127 | 1/1987 | Kurogi et al. | 156/612 |
| 4,670,086 | 6/1987 | Leamy | 156/DIG. 80 |
| 4,671,970 | 6/1987 | Keiser et al. | 427/95 |

OTHER PUBLICATIONS

Jastrzabski et al., Journal of Electrochemical Society, vol. 130, No. 7 (1983), pp. 1571–1579.

Filby et al., British Journal of Applied Physics, vol. 18, No. 10, Oct. 1982, pp. 1357–1382.

J.W. Matthews, "Epitaxial Growth Part A" Academic Press, 1975, pp. 12, 21, 413 & 428.

Grayson editor *Encyclopedia of Semiconductor Technology* John Wiley and Sons, New York 1984 p. 811.

Brice, Crystal Growth Processes, Blackie, publishing, London, 1986 p. 75.

W.A.P. Claasssen and J. Bloem, "The Nucleation of CVD Silicon on $SiO_2$ and $S_3N_4$ Substrates", J. Electrochem. Soc., vol. 127, 1980 pp. 1836–1842.

W.A.P. Claasssen and J. Bloem, "The Nucleation of CVD Silicon on $SiO_2$ and $S_3N_4$ Substrates" J. Electrochem. Soc., vol. 128, 1991, pp. 1353–1359.

"McGraw–Hill Dictionary of Scientific and Technical Terms", Fourth Edition, McGraw–Hill Book Company (definition of seed).

John H. Perry, Chemical Engineers' Handbook, Fourth Edition, 1963 pp. 8–1, 8–2 and 8–7.

L. Jastrzebski, Solid State Technology, vol. 27, 1984, pp. 239–243.

D.D. Rathman et al., J. Electrochem Soc., vol. 129, 1982, pp. 2303–2306.

METHOD FOR FORMING CRYSTAL AND CRYSTAL ARTICLE OBTAINED BY SAID METHOD

This application is a continuation of application Ser. No. 08/139,060 filed Oct. 21, 1993, now abandoned which, in turn, is a continuation of application Ser. No. 07/911,791 filed Jul. 10, 1992, now abandoned which is a continuation of application Ser. No. 07/620,395 filed Nov. 30, 1990, now abandoned, which is a continuation of application Ser. No. 07/158,112 filed Feb. 16, 1988, now abandoned, which is a continuation of application Ser. No. 07/031,046 filed Mar. 27, 1987, now abandoned.

BACKGROUND OF THE INVENTION

1. Field of the Invention

This invention relates to a method for forming a crystal and a crystal article obtained by said method, particularly to a method for forming a single crystal or a polycrystal controlled in grain size prepered by utilizing the difference in nucleation density of the deposited materials according to the kinds of the deposited surface materials, and a crystal article obtained by said method.

The present invention is applicable for formation of a crystal such as a single crystal or a polycrystal to be used for electronic devices, optical devices, magnetic devices, piezoelectric devices or surface acoustic devices, etc., such as semiconductor integrated circuits, optical integrated circuits, magnetic circuits, etc.

2. Related Background Art

In the prior art, single crystal thin films to be used for semiconductor electronic devices or optical devices have been formed by epitaxial growth on a single crystal substrate. For example, it has been known that epitaxial growth of Si, Ge, GaAs, etc., can be done from liquid phase, gas phase or solid phase on Si single crystal substrate (silicon wafer), and it has been also known that epitaxial growth of a single crystal such as GaAs, GaAlAs, etc., occurs on a GaAs single crystal substrate. By use of the semiconductor thin film thus formed, semiconductor devices and integrated circuits, electroluminescent devices such as semiconductor lasers or LED have been prepared.

Also, researches and developments have been recently made abundantly about ultra-high speed transistors by use of two-dimensional electronic gas, ultra-lattice devices utilizing quantum well, etc., and what has made these possible is the high precision epitaxial technique such as MBE (molecular beam epitaxy) or MOCVD (organometallic chemical vapor deposition) by use of ultra-high vacuum.

In such epitaxial growth on a single crystal substrate, it is necessary to match lattice constants and coefficient of thermal expansion between the single crystal material of the substrate and the epitaxial growth layer. For example, although it is possible to effect epitaxial growth of Si single crystal thin film on sapphire which is an insulating single crystal substrate, the crystal lattice defect at the interface due to deviation in lattice constant and diffusion of aluminum which is a component of sapphire to the epitaxial layer pose problems in application for electronic devices or circuits.

Thus, the method for forming a single crystal thin film of the prior art by epitaxial growth may be understood to be dependent greatly on its substrate material. Mathews et al have examined about combination of the substrate material with epitaxial growth layer (EPITAXIAL GROWTH, Academic Press, New York, 1975, ed, by J. W. Mathews).

Also, the size of the substrate is presently about 6 inches for Si wafer, and enlargement of GaAs, sapphire substrate is further retarded. In addition, since the single crystal substrate is high in production cost, the cost per chip becomes higher.

Thus, for production of a single crystal layer capable of preparing a device of good quality according to the method of prior art, there has been involved the problem that the kinds of the substrate materials are limited to an extremely narrow scope.

On the other hand, researches and developments of three-dimensional integrated circuits to accomplish high integration and multi-function by laminating semiconductor devices in the normal line direction of the substrate have been abundantly made in recent years. Research and development of large area semiconductor devices such as solar batteries or switching transistors of liquid crystal picture elements, etc., in which devices are arranged in an array on a cheap glass are becoming more abundant from year to year.

What is common to both of these is that the technique for forming a semiconductor thin film on an amorphous insulating material and forming an electronic device such as transistor, etc., thereon is required. The technique for forming a single crystal semiconductor of high quality on an amorphous insulating material has been particularly desired.

Generally speaking, when a thin film is deposited on an amorphous insulating material substrate such as $SiO_2$, etc., due to the defect of long distance order of the substrate material, the crystal structure of the deposited film becomes amorphous or polycrystalline. Here, the amorphous film refers to a state in which near distance order to the extent of the closest atoms is preserved, but no longer distance order exists. The polycrystalline film refers to single crystal grains having no specific crystal direction gathered as separated at the grain boundaries.

For example, in the case of forming Si on $SiO_2$ according to the CVD method, if the deposition temperature is about 600° C. or lower, it becomes an amorphous silicon. It becomes a polycrystalline silicon with grain sizes distributed between some hundred to some thousand Å at a temperature higher than said temperature. However, the grain sizes and their distribution of polycrystalline silicon will be varied greatly depending on the formation method.

Further, by melting and solidifying an amorphous or polycrystalline film by an energy beam such as a laser or rod-shaped heater, etc., a polycrystalline thin film with great grain sizes of some microns or millimeters has been obtained (Single Crystal silicon on non-single-crystal insulator, Journal of crystal Growth vol. 63, No. 3, Oct., 1983 edited by G. W. Cullen).

When a transistor is formed on the thus formed thin film of respective crystal structures and electron mobility is measured from its characteristics, mobility of about 0.1 $cm^2$/V·sec or less is obtained for amorphous silicon, mobility of 1 to 10 $cm^2$/V·sec for polycrystalline silicon having grain sizes of some hundred Å, and a mobility to the same extent as in the case of single crystalline silicon for polycrystalline silicon with great grain sizes by melting and solidification.

From these results, it can be understood that there is great difference in electrical properties between the device formed in the single crystal region within the crystal grains and the device formed as bridging across the grain boundary. In other words, the deposited film on the amorphous material obtained in the prior art becomes an amorphous or polycrystalline structure having grain size distribution, and the device prepared thereon is greatly inferior in its performance as compared with the device prepared on the single crystal layer. For this reason, the uses are limited to simple switching devices, solar batteries, photoelectric converting devices, etc.

On the other hand, the method for forming a polycrystalline thin film with great grain sizes by melting and solidification had the problems that an enormous time is required due to scanning of the amorphous or single crystal thin film with an energy beam for every wafer resulting in poor bulk productivity, and also that it is not suited for enlargement of area.

Further, in recent years, studies of diamond thin film growth are becoming popular. Diamond thin film, which is particularly broad in bandgap as 5.5 eV as the semiconductor, can be actuated at higher temperatures (about 500° C. or less) as compared with Si, Ge, GaAs, etc., which are semiconductor materials of the prior art. Also, the carrier mobility of both electrons and positive holes surpasses that of Si (1800 $cm^2$/V·sec for electrons, 1600 $cm^2$/V·sec for positive holes), and thermal conductivity is also extremely high. For this reason, diamond thin film has been expected to be promising for use in semiconductor devices of the great consumption power type with great heat generation quantity.

However, although there have been reports in the prior art about epitaxial growth of diamond thin film on a diamond substrate by vapor phase growth (N. Fujimoto, T. Imai and A. Doi Pro. of Int. Cou. IPAT), there is no successful report about heteroepitaxial growth on a substrate other than diamond substrate.

Generally speaking, diamond nuclei are generated by utilizing excitation with microwave, using a hydrocarbon type gas such as $CH_4$, etc., and by irradiation with a hot filament or electron beam. However, the nucleation density is generally low, whereby a continuous thin film can be obtained with difficulty. Even if a continuous thin film may be formed, it has a polycrystalline structure with great grain size distribution and can be difficult to apply to a semiconductor device.

Also, as long as a diamond substrate is used, it is expensive as a matter of course, posing a problem in use in large areas. Thus, it is not suitable for practical application.

As described above, in the crystal growth method of the prior art and the crystal formed thereby, three-dimensional integration or enlargement of area could not be done with ease and is difficult to apply practically for devices. Crystal such as single crystals and polycrystals, etc., required for preparation of devices having excellent characteristics could not be formed easily and at low cost.

SUMMARY OF THE INVENTION

A main object of the present invention is to provide a method for forming a crystal which has overcome the problems of the prior art as described above and a crystal article obtained by said method.

Another object of the present invention is to provide a method for forming a crystal of good quality such as single crystal containing no grain boundary or a polycrystal controlled in grain boundary, etc., without restriction with respect to the base materials, for example, without restriction with respect to materials, constitutions, sizes, etc., of the substrate, and a crystal article having the crystal obtained by said method.

Still another object of the present invention is to provide a method for forming the above crystal with good efficiency according to simple steps without use of a special device.

Still another object of the present invention is to provide a crystal article having a single crystal which is grown singly on a nucleation surface ($S_{NDL}$), which nucleation surface ($S_{NDL}$) is formed at a concavity on a crystal forming surface with a material having sufficiently greater nucleation density (ND) than the material forming said crystal forming surface and has a sufficiently small area to the extent that only a single nucleus can be grown.

Still another object of the present invention is to provide a method for forming a crystal by utilizing the difference in nucleation density of the crystal forming materials according to the kinds of the materials forming the crystal forming surface, which comprises forming at a concavity on said crystal forming surface a nucleation surface ($S_{NDL}$) with a material having sufficiently greater nucleation density than the material forming said crystal forming surface having a sufficiently small area so that only a single nucleus may grow thereon, forming only a single nucleus on said nucleation surface ($S_{NDL}$), and growing a single crystal from said single nucleus, thereby forming a crystal.

Still another object of the present invention is to provide a method for forming crystal, which comprises applying a crystal forming treatment on a substrate having a free surface comprising a nonnucleation surface ($S_{NDS}$) with a small nucleation density and a nucleation surface ($S_{NDL}$) exposed from said nonnucleation surface, having a sufficiently small area for a crystal growing only from a single nucleus and having a greater nucleation density ($ND_L$) than the nucleation density ($ND_S$) of said nonnucleation surface ($S_{NDS}$), thereby growing a single crystal from said single nucleus.

Still another object of the present invention is to provide a method for forming a crystal, which comprises forming a nucleation surface ($S_{NDL}$) at a desired site of a base substrate surface with large nucleation density exposed as a small area for a crystal to grow from only a single nucleus by providing onto said base substrate surface a nonnucleation surface ($S_{NDS}$) having smaller nucleation density ($ND_S$) than the nucleation density ($ND_L$) of said nucleation surface ($S_{NDL}$) by addition of a material ($N_S$) for forming said nonnucleation surface ($S_{NDS}$) which is different from the material ($M_L$) forming said nucleation surface ($S_{NDL}$) to obtain a substrate, and then applying a crystal forming treatment on said substrate to form a single crystal nucleus on said nucleation surface ($S_{NDL}$), thereby growing a single crystal from said single nucleus.

Still another object of the present invention is to provide a method for forming a crystal, which comprises applying a crystal forming treatment on a substrate having two kinds of crystal formation surfaces with a sufficiently great nucleation density difference ($\Delta ND$). The nucleation surface ($S_{NDL}$) with greater nucleation density is exposed from the nonnucleation surface ($S_{NDS}$) with smaller nucleation density and has a sufficiently small area for a single crystal growing from only a single nucleus to form a stable single nucleus on said nucleation surface ($S_{NDL}$), thereby growing a single crystal from said single nucleus.

Still another object of the present invention is to provide a crystal article, comprising a substrate having a nonnucleation surface ($S_{NDS}$) with small nucleation density and a nucleation surface ($S_{NDL}$), arranged as underlying said nonnucleation surface ($S_{NDS}$), having a sufficiently small area for a crystal growing from only a single nucleus and having greater nucleation density ($ND_L$) than the nucleation density ($ND_S$), and a single crystal which grows from said single nucleus and covers excessively over said nucleation surface ($S_{NDL}$).

DETAILED DESCRIPTION OF THE PREFERRED EMBODIMENTS

For better understanding of the present invention, first the general process for forming a thin film of metal for semiconductor is explained.

When the deposition surface is made of a material different in kind from the flying atom, particularly an amorphous material, the flying atoms are diffused freely on the substrate surface, or again evaporated (released). And, as the result of collision mutually between the atoms, a nucleus is formed and when its size becomes the size rc ($=-2^\circ o/gv$) at which its free energy G becomes the maximum (critical nucleus), G is reduced and the nucleus continues to grow stably three-dimensionally to become shaped in an island. The nucleus with the size exceeding rc is called "stable nucleus", and unless otherwise particularly noted, "nucleus" in the following basic description of the present invention refers to this "stable nucleus". Also, among "stable nucleus", those with small r are called "initial nucleus".

The free energy generated by formation of nucleus is represented as follows:

$$G = 4\pi f(\theta)(\sigma_o r^2 + \tfrac{1}{3} \cdot gv \cdot r^3) f(\theta) = \tfrac{1}{4}(2 - 3\cos\theta + \cos^2\theta)$$

wherein, r: radius curvature of nucleus
  θ: contact angle of nucleus
  gv: free energy per unit deposition
  $\rho_o$: surface energy between nucleus and vaccuum.

Figure 1:
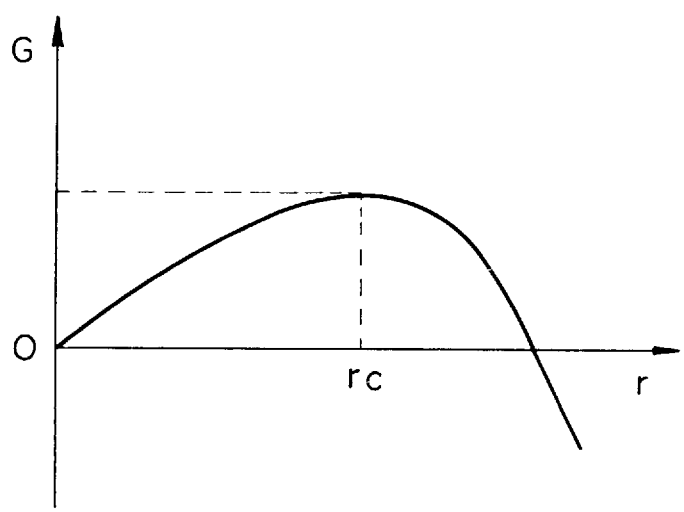
FIG. 1 is a graph for illustration of the relationship between the size of nucleus rc and free energy G in the process of forming thin film.

FIG. 1 shows the manner in which free energy G is changed. In the same Figure, the radius of curvature of the stable nucleus when free energy G is at the maximum value is rc.

Thus, nuclei grow to become shaped in islands, and further grow whereby contact mutally between islands progresses until sometimes coalescence occurs and via a network structure, it finally becomes a continuous film to covering completely over the substrate surface. Following such a process, a thin film is deposited on the substrate.

In the deposition process as described above, the density of nucleus formed per unit area of the substrate surface, the size of nucleus and the nucleation speed are determined depending on the state of the system of deposition. Particularly the interaction between the flying atoms and the substrate surface material is an important factor. Also, a specific crystal direction grows in parallel to the substrate due to anisotropy relative to the crystal surface of the interface energy at the interface between the deposited material and the substrate. When the substrate is amorphous, the crystal direction within the substrate plane is not constant. For this reason, grain boundaries are formed by collision between nuclei or islands, and particularly in the case of collision between islands, grain boundaries are formed as such upon occurrence of coalescence. Since the grain boundaries formed are difficultly movable in the solid phase, the grain sizes are determined at that point.

Next, the selective deposition method for forming a deposited film on the deposition surface is to be described. The selective deposition method is a method in which a thin film is formed on the substrate by utilizing the differences between the materials in factors influencing nucleus formation in the thin film forming process such as surface energy, attachment coefficient, release coefficient, surface diffusion speed, etc.

Figure 2A:
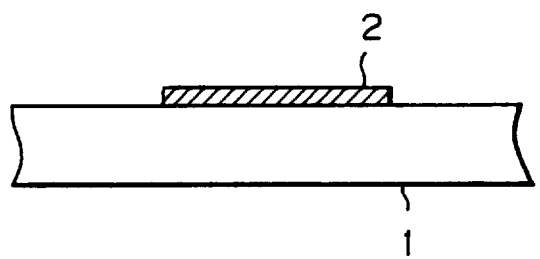
FIGS. 2A and 2B are illustrations of the selective deposition method.
Figure 2B:
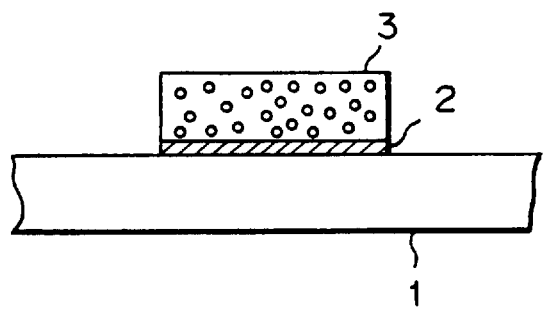

FIGS. 2A and 2B are illustrations of the selective deposition method. First, as shown in FIG. 2A, on the substrate 1, a thin film 2 comprising a material different in the above factors from the substrate 1 is formed at a desired portion. And, when deposition of a thin film comprising an appropriate material is effected under appropriate deposition conditions, a thin film 3 grows only on the thin film 2, whereby it is possible to give rise to a phenomenon that no growth occurs on the substrate 1. By utilizing this phenomenon, the thin film 3 formed self-matchingly can be grown, whereby it becomes possible to omit the lithographic step by use of a resist as practiced in the prior art.

As the material for enabling deposition according to such selective formation method, for example, $SiO_2$ may be used as the substrate 1, Si, GaAs, silicon nitride as the thin film 2 and Si, W, GaAs, InP, etc., as the thin film 3 to be deposited.

Figure 3:
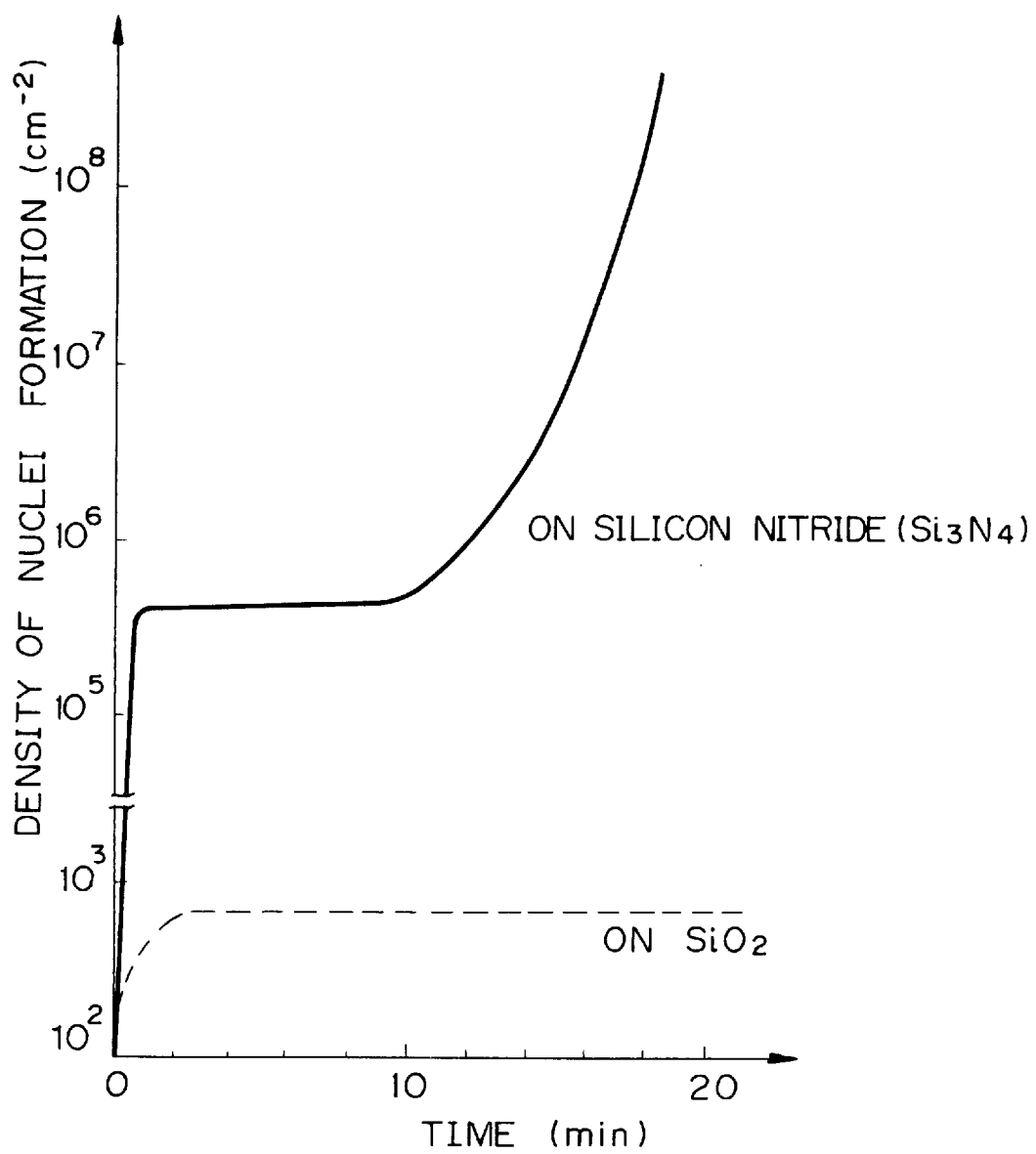
FIG. 3 is a graph showing the change with lapse of time of nucleation density (ND) on the deposition surface of $SiO_2$ and the deposition surface of silicon nitride.

FIG. 3 is a graph showing the change with lapse of time of nucleation density (ND) on the deposited surface of $SiO_2$ and the deposited surface of silicon nitride.

As shown in the same graph, soon after initiation of deposition, the nucleation density (ND) on $SiO_2$ is saturated at $10^3$ $cm^{-2}$ or less, and the value is not substantially changed even after 20 minutes.

In contrast, on silicon nitride ($Si_3N_4$), it is once saturated at about $4 \times 10^5$ $cm^{-2}$ or less, is not substantially changed 10 minutes thereafter, but is abruptly increased thereafter. This measurement example shows the case in which $SiCl_4$ gas is diluted with $H_2$ and deposited according to the CVD method under the conditions of a pressure of 170 Torr and a temperature of 1000° C. Otherwise, the same action can be obtained by use of $SiH_4$, $SiH_2Cl_2$, $SiHCl_3$, $SiF_4$, etc., as the reaction gas, and controlling the pressure, temperature, etc. Also, vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ perfectly zero.

Such a phenomenon depends greatly on the difference in adsorption coefficient, release coefficient, surface diffusion coefficient, etc., relative to Si of the material surfaces of $SiO_2$ and silicon nitride, but the fact that $SiO_2$ itself is etched by the reaction of $SiO_2$ with Si atom itself to form silicon monooxide with higher vapor pressure, while no such etching phenomenon occurs on silicon nitride may be also considered to be a cause to effect selective deposition (T. Yonehara, S. Yoshioka, S. Miyazawa, Journal of Applied Physics 53, 6839, 1982).

Thus, by selecting $SiO_2$ and silicon nitride as the materials of the deposition surface and silicon as the material to be deposited, sufficiently great nucleation density difference ($\Delta ND$) as shown in the same graph can be obtained. Here, although $SiO_2$ is desirable as the material for the deposition surface, this invention is not so limited, and sufficiently practical nucleation density difference ($\Delta ND$) can be obtained even by use of $SiO_x$ ($0<x<2$).

Of course, the present invention is not limited to these materials, but the difference in nucleation density ($\Delta ND$) may be sufficiently $10^3$-fold or more in density of nuclei as shown by the same graph, and sufficient selective formation of deposited film can be done with the materials as exemplified below.

As another method for obtaining this nucleation density difference ($\Delta ND$), for example, a thin film of silicon nitride such as SiN, $Si_3N_4$, etc., which is a material ($M_L$) with greater nucleation density relative to Si is formed on an appropriate base substrate. Subsequently $SiO_2$ thin film is formed on said silicon nitride thin film and thereafter said $SiO_2$ thin film is removed locally with a desired size, thereby forming a region in which the silicon nitride thin film is exposed.

As still another method for obtaining this nucleation density difference ($\Delta ND$), for example, after a $Si_3N_4$ thin film is uniformly provided on the surface of an appropriate base substrate, a $SiO_2$ thin film may be formed selectively on said $Si_3N_4$ thin film so that exposed portions of the $Si_3N_4$ thin film may be provided locally.

The present invention utilizes selective deposition based on such nucleation density difference ($\Delta ND$) and. By forming a sufficiently minute region of a different kind of material having sufficiently greater nucleation density than the material of the deposition surface so that a single nucleus may grow on the region, a single crystal is to be grown selectively only at the site where such fine different kind of material exists.

In this connection, since selective growth of a single crystal is determined depending on the electron state of the crystal formation surface, particularly the state of dangling bonds, the material with higher nucleation density (for example, $Si_3N_4$) is not required to be a bulk material, but it may also be formed as a thin film on the surface of base plate of any desired material to form the above crystal formation surface.

In the following, the present invention is described in detail by referring to the drawings.

Figure 4A:
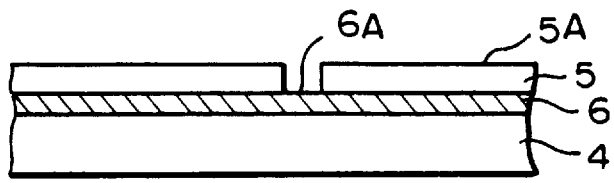
FIGS. 4A to 4D are illustrations of the formation steps showing a first embodiment of the method for forming crystal according to the present invention.
Figure 4B:
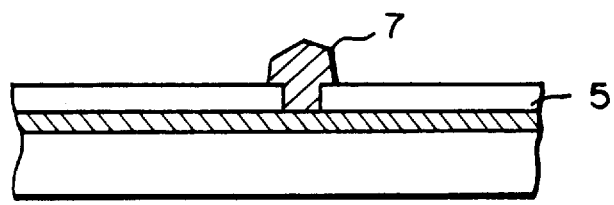
Figure 4C:
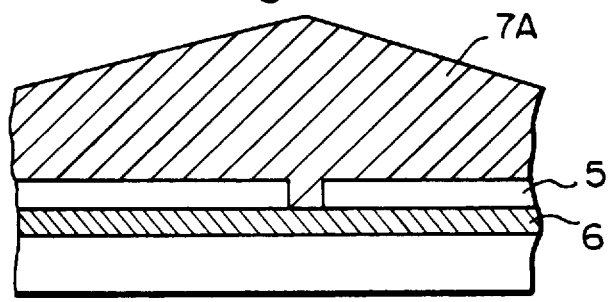
Figure 4D:
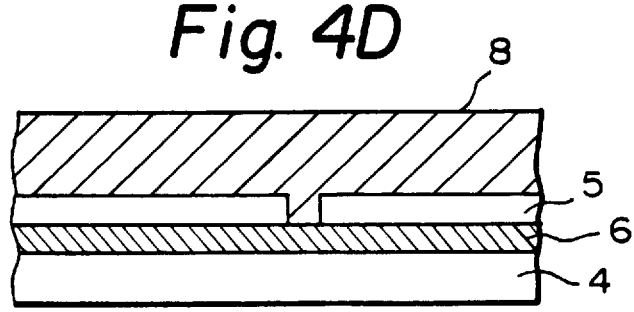
Figure 5A:
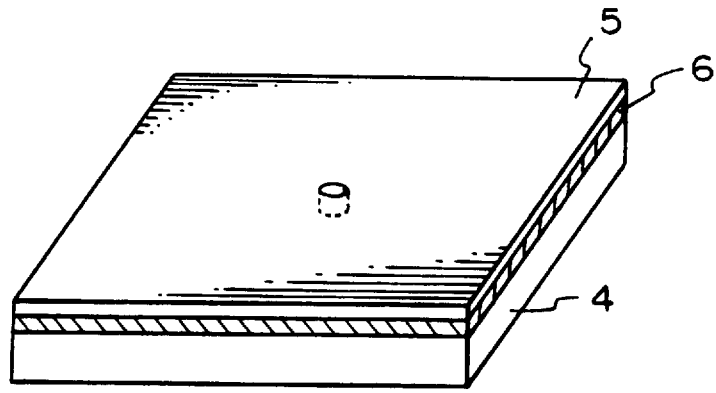
FIGS. 5A and 5B are perspective views of the substrate in FIGS. 4A and 4D.
Figure 5B:
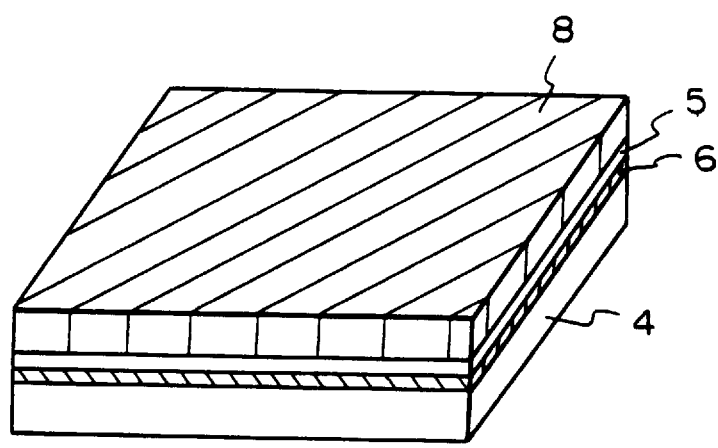
Figure 6A:
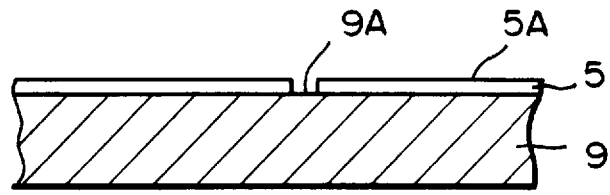
FIGS. 6A to 6D are illustrations of the steps for forming crystal showing a second embodiment of the present invention.
Figure 6B:
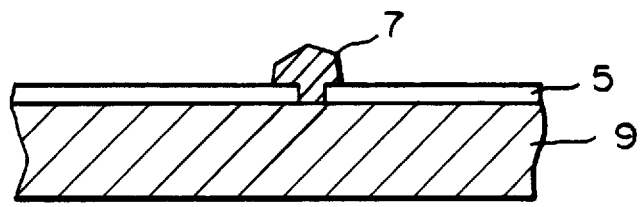
Figure 6C:
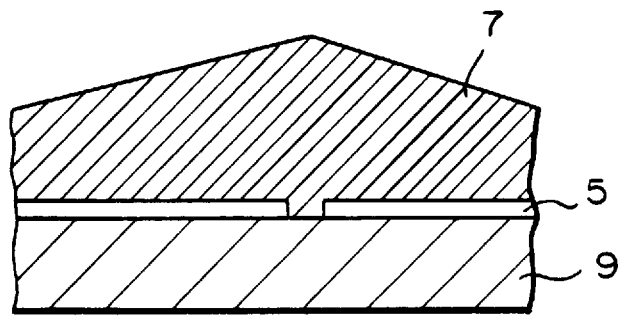
Figure 6D:
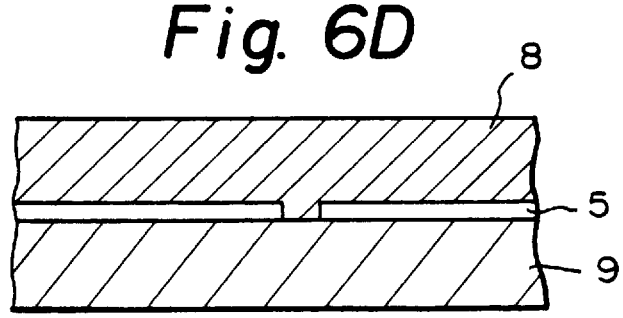

FIGS. 4(A)–4(D) are illustrations of the formation steps showing a first embodiment of the method for forming crystal according to the present invention, and FIGS. 5(A) and 5(B) are perspective views corresponding to FIGS. 4(A) and 4(D).

First, as shown in FIG. 4(A) and FIG. 5(A), on the base substrate 4 is formed a thin film 6 (or called "Seed") [forming nucleation surface ($S_{NDL}$) 6A] with greater nucleation density enabling selective nucleation, on which a material different from the material forming the thin film 6 with greater nucleation density is thinly deposited, followed by patterning according to lithography, etc., to form a thin film 5 comprising a different material and forming nonnucleation surface ($S_{NDS}$) 5A so as to provide sufficiently finely nucleation surfaces ($S_{NDL}$) 6A. However, the size, the crystal structure and composition of the base substrate 4 may be chosen as desired, and it may be also a substrate having a functional device prepared according to conventional semiconductor technique formed thereon. Also, the nucleation surface ($S_{NDL}$) 6A comprising a different material may be also formed as a modified region containing excessive Si or N, which may be formed by forming a thin film 6 beneath the $SiO_2$ thin film 5 of a polycrystalline silicon or $SiO_2$, and injecting ions of Si or N into the exposed portions 6A.

Next, by selection of appropriate deposition conditions, a single nucleus of crystal formation material is formed only on the nucleation surface ($S_{NDL}$) 6A. That is, the nucleation surface ($S_{NDL}$) 6A is required to be formed sufficiently minutely so that only a single nucleus may be formed thereon. The size of the nucleation surface ($S_{NDL}$) 6A, which may differ depending on the kind of the material, may be several microns or less. Further, the nucleus grows while maintaining a single crystal structure to become a single crystal grain 7 in shape of an island as shown in FIG. 4(B). For forming an island-shaped single crystal grain 7, it is desirable to determine the conditions so that nonnucleation may occur at all on the thin film 5A, as already mentioned.

The island-shaped single crystal grain 7 further grows while maintaining the single crystal structure with the nucleation surface ($S_{NDL}$) 6A as the center (lateral overgrowth), whereby it can cover over the whole surface of the thin film 5 as shown in FIG. 4(C) (single crystal 7A).

Subsequently, if necessary, the single crystal 7A is flattened by etching or polishing, and a single crystal layer 8 capable of forming a desired device can be formed on the thin film 5 as shown in FIG. 4(D) and FIG. 5(B).

Thus, due to formation of the thin film 6 forming the nucleation surface ($S_{NDL}$) 6A on the substrate 4, any desired material can be used for the substrate 4 which is the supporting member. Further, in such a case, even when the substrate 4 may be one having a functional device, etc., formed thereon according to conventional semiconductor technique, the single crystal layer 8 can be easily formed thereon.

In the above embodiment, the nucleation surface ($S_{NDL}$) 6A is formed of thin film 6, but a substrate comprising a material with large nucleation density (ND) enabling selective nucleation may be used as such and nonnucleation surfaces ($S_{NDS}$) may be provided at any desired positions to form single crystal layers similarly thereon as shown in FIG. 6.

FIGS. 6(A)–6(D) are illustrations of the steps for forming crystal showing a second embodiment of the present invention. As shown in these figures, on a substarte 9 comprising a material with large nucleation density (ND) enabling selective nucleation, the nonnucleation surface ($S_{NDS}$) comprising a material with small nucleation density (ND) can be formed so as to give exposed portions of the substrate 9 as nucleation surface ($S_{NDL}$) 9A sufficiently minutely to form a single crystal layer 8 similarly as in the first embodiment.

Figure 7A:
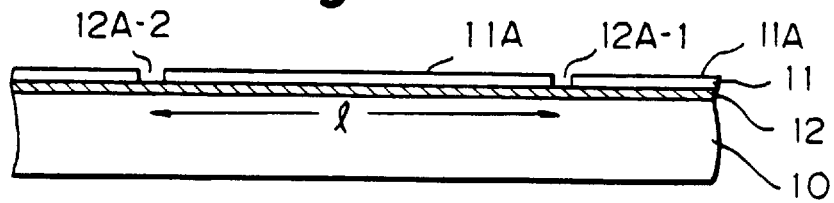
FIGS. 7A to 7D are illustrations of the formation steps showing a third embodiment of the method for forming single crystal according to the present invention.
Figure 7B:
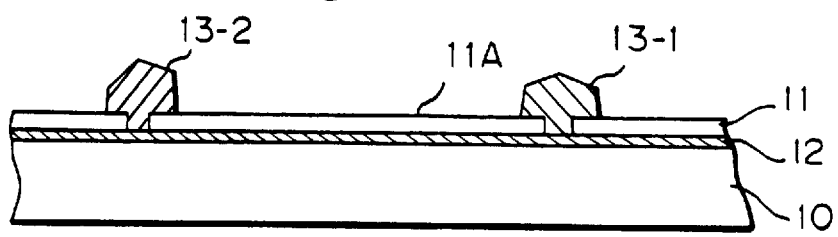
Figure 7C:
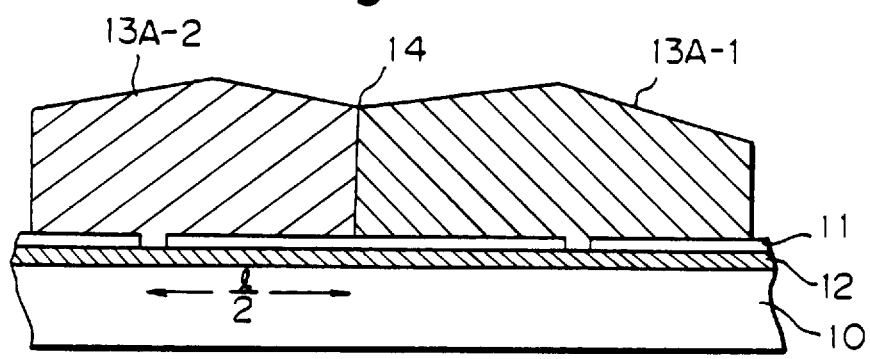
Figure 7D:
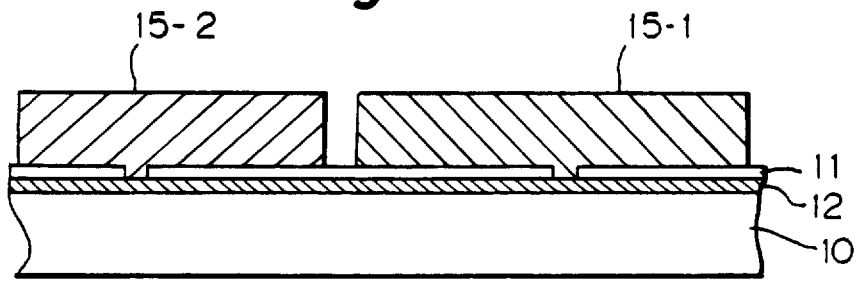
Figure 8A:
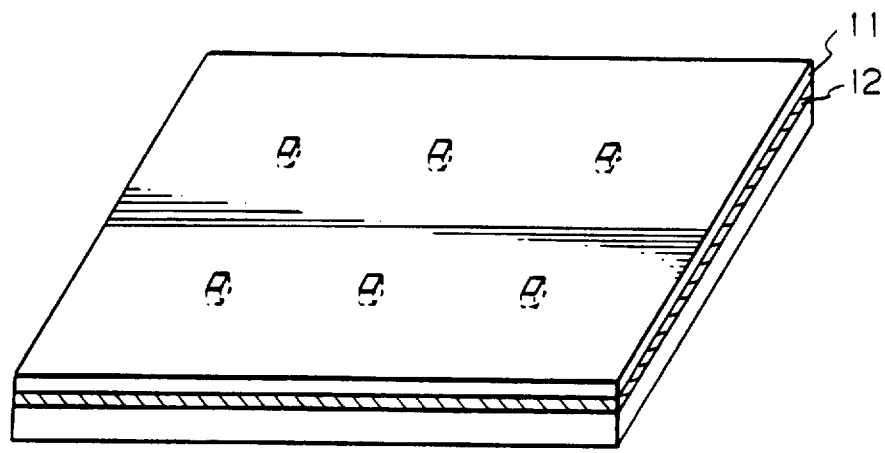
FIGS. 8A and 8B are perspective views of the substrates in FIGS. 7A and 7D.
Figure 8B:
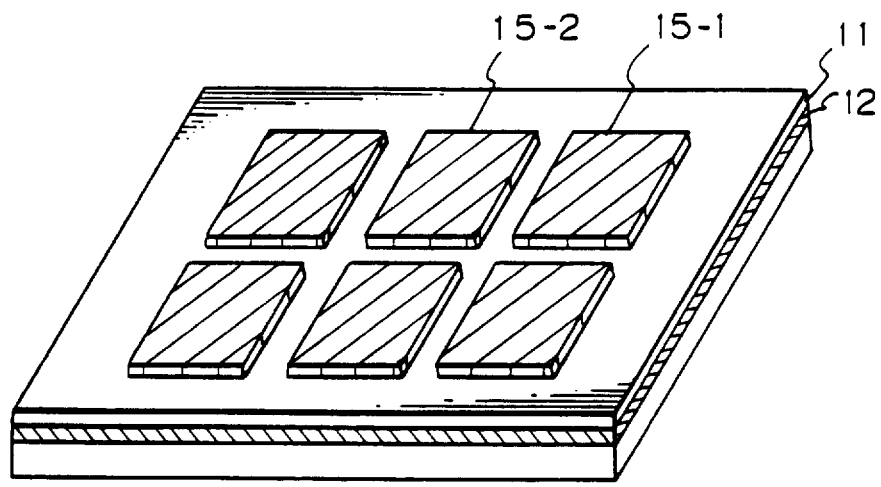

FIGS. 7(A)–7(D) are illustrations of the formation steps showing a third embodiment of the method for forming crystal according to the present invention, and FIGS. 8(A) and 8(B) are perspective views corresponding to FIGS. 7(A) and 7(D).

As shown in FIG. 7(A) and FIG. 8(A), on an appropriate base substrate 10 such as glass substrate, etc., an amorphous insulating thin film 12 with relatively greater nucleation density (ND) such as $Si_3H_4$, etc., is provided. On said thin film 12 is formed selectively a thin film 11 at a desired position with a different material having smaller nucleation density relative to the material forming the thin film 12 which enables the above selective nucleation with an interval of a distance l, thereby arranging nucleation surfaces ($S_{NDL}$) 12A-1, 12A-2 with sufficiently small areas so as to form only a single nucleus thereon. This distance l may be set at a size which is equal to or greater than the size of the single crystal region required for formation of a semiconductor device or a group of devices.

Next, by selecting appropriate crystal forming conditions, on the nucleation surface ($S_{NDL}$) 12-1, 12-2 only a nucleus of a crystal forming material is formed. That is, as described above, the nucleation surfaces 12-1, 12-2 are required to be formed to a sufficiently fine size (area) to the extent that only a single nucleus may be formed. The size of the nucleation surfaces ($S_{NDL}$) 12-1, 12-2, which may be different depending on the kinds of the material, may be several microns or less. Further, the nucleus formed as above grows while maintaining the single crystal structure, and become island-shaped single crystal grains 13-1, 13-2 as shown in FIG. 7(B). For forming island-shaped single crystal grains 13-1, 13-2, it is desirable to determine the conditions so that substantially no nucleation may occur at all on other surfaces than the nucleation surfaces ($S_{NDL}$) 12A-1, 12A-2, [nonnucleation surface ($S_{NDS}$) 11A].

The crystal direction in the normal line direction of the thin film 12 of the island-shaped single crystal grains 13-1, 13-2 is determined so as to make the interface energy of the material of the film 12 and the material forming nucleus of a minimum. For, surface or interface energy has anisotropy depending on the crystal face. However, as already mentioned, the crystal direction within the surface plane in amorphous surface is not determined.

The island-shaped single crystal grains 13-1, 13-2 further grow to become single crystals 13A-1, 13A-2 until the adjacent single crystals 13A-1, 13A-2 contact each other as shown in FIG. 7(C). Since the crystal directions within the substrate plane vary from one single crystal to another, a crystal grain boundary 14 is formed at the intermediate position between the nucleation surfaces ($S_{NDL}$) 12-1 and 12-2.

Subsequently, the single crystals 13A-1, 13A-2 grow three-dimensionally, but crystal faces with slow growth speed appear as the facet. For this reason, the surfaces of single crystals 13A-1, 13A-2 are flattened by etching or polishing. Since the portion of the grain boundary 14 is removed to form thin films of single crystals 15-1, 15-2, containing no grain boundary in shape of lattices as shown in FIG. 7(D) and FIG. 8(B). The size of the single crystal films 15-1, 15-2, is determined by the interval l between the nucleation surfaces ($S_{NDL}$) 12A-1, 12A-2 as described above. That is, by determining appropriately the formation pattern of the nucleation surface ($S_{NDL}$) 12A-1, 12A-2, the position of the grain boundary can he controlled to form single crystals with desired sizes at a desired arrangement.

Figure 9A:
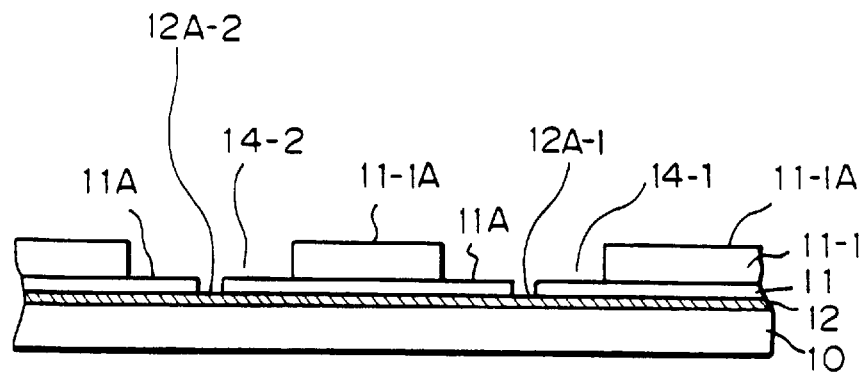
FIGS. 9A to 9C are illustrations of the steps for forming crystal showing a fourth embodiment of the present invention.
Figure 9B:
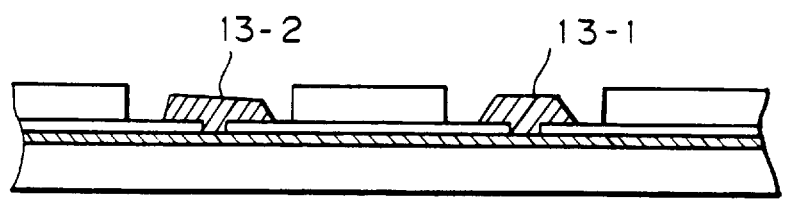
Figure 9C:
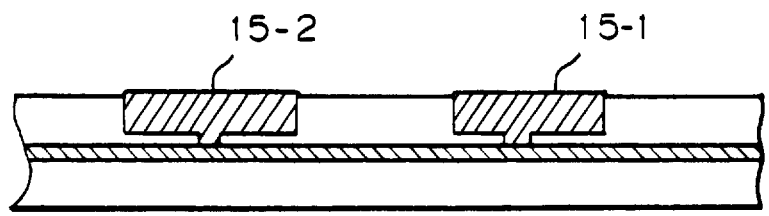
Figure 10A:
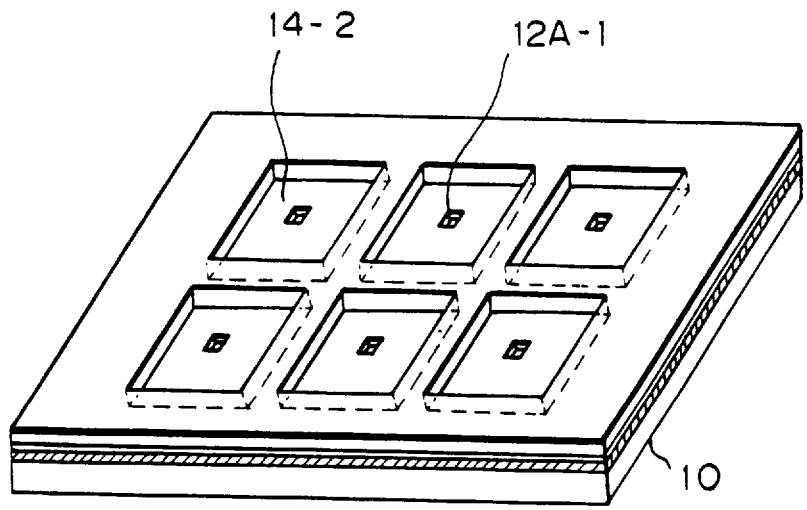
FIGS. 10A and 10B are perspective views of the substrates in FIGS. 9A and 9C.
Figure 10B:
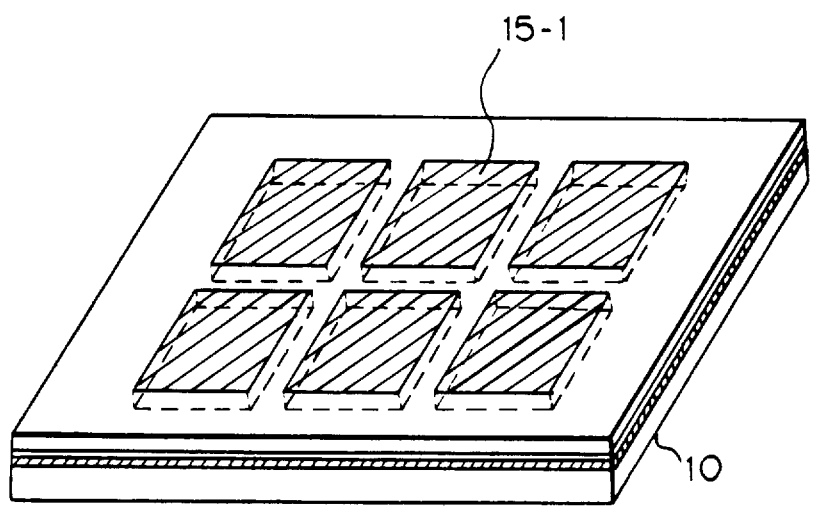

FIGS. 9(A)–9(C) are illustrations of the formation steps showing a fourth embodiment of the method for forming crystal according to the present invention, and FIGS. 10(A) –10(B) are perspective views of the substrates in FIGS. 9(A) and 9(C).

First, as shown in FIG. 9(A) and FIG. 10(A), similarly as shown in the step (A) in FIG. 1, thin films 12 and 11 are provided on the base substrate 10 to form nucleation surfaces ($S_{NDL}$) 12A-1, 12A-2 and nonnucleation surface ($S_{NDS}$) 11A. Subsequently, so that concavities 14-1, 14-2 with desired sizes and shapes may be provided at the corresponding positions to the nucleation surfaces ($S_{NDL}$) 12A-1, 12A-2, a thin film 11-1 is formed with the same material as the thin film 11A or a material having nucleation density equal to or smaller than said material. Thus, a substrate for formation of crystal having nucleation surfaces ($S_{NDL}$) 12A-1, 12A-2 with sufficiently fine sizes for forming only single nucleus within concavities 14-1, 14-2 is formed.

Subsequently, as shown in FIG. 9(B), island-shaped single crystal grains 13 are grown similarly as in the first embodiment.

And, as shown in FIG. 9(C) and FIG. 10(B), single crystal grains 13-1, 13-2 are grown until embedding the concavity 14-1, 14-2 to form a single crystal layer 15-1, 15-2.

In this embodiment, since single crystal grains 13-1, 13-2 grow within the concavity 14-1, 14-2, the steps of flattening and removing the grain portion may be unnecessary.

Figure 11:
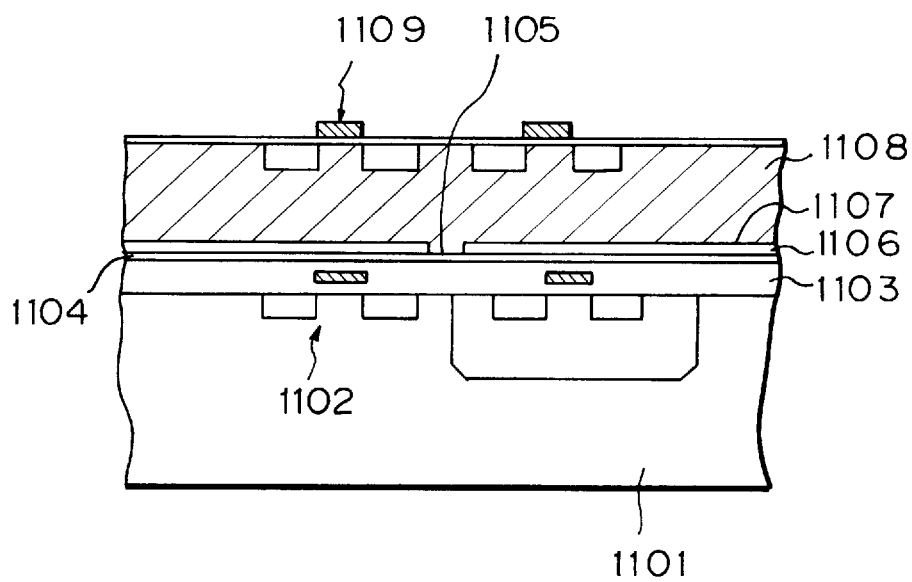
FIG. 11 is a schematic sectional view showing an example of the multi-layer structure by use of the first embodiment of the present invention.

FIG. 11 is a schematic sectional view showing an example of the semiconductor electronic device with a multi-layer structure produced by use of the first embodiment of the present invention.

In FIG. 11 on the semiconductor substrate 1101 such as Si or GaAs, transistors 1102 or other semiconductor devices or optical devices are formed, and $Si_3N_4$ layer 1104 having, a surface for formation of, for example, nucleation surface ($S_{NDL}$) 1105 is formed thereon according to the CVD method or the sputtering method. And, as already mentioned, nucleation surfaces ($S_{NDL}$) 1105 are exposed as sufficiently minute areas so that only a single nucleus may be formed and a thin film 1106 of, for example, $Si_3N_4$ having nonnucleation surface ($S_{NDS}$) 1107 is formed. From said nucleation surface ($S_{NDL}$) 1105 single crystal layer 1108 is formed. In the Figure, 1103 denotes $SiO_2$ layer.

Subsequently, on the single crystal layer 1108 are formed transistors 1109 or other semiconductor devices or optical devices, and the devices formed respectively on the substrate 1101 and the Si single crystal layer 1107 are electrically connected through the $Si_3N_4$ layer 1104. Thus, for example, by forming the transistor 1102 of the first layer (substrate 1101) and the transistor 1109 of the second layer (single crystal layer 1108) respectively as the MOS transistors, and connecting these to form CMOS, a CMOS entirely free from mutual interaction can be produced. Also, according to the technique as described above, an electroluminescent device can be also formed integrated with its driving circuit to accomplish a high degree of integration.

Further, by repeating this embodiment, single crystal layers 1108 can be formed in many layers with $Si_3N_4$ layer 1104 sandwiched therebetween, whereby a semiconductor electronic device with a multiple structure can be formed easily.

Figure 12A:
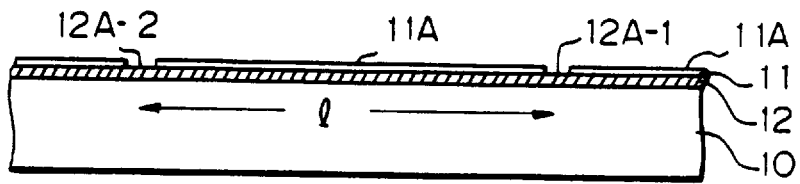
FIGS. 12A to 12D are illustrations of the steps for forming crystal showing an eighth embodiment of the present invention.
Figure 12B:
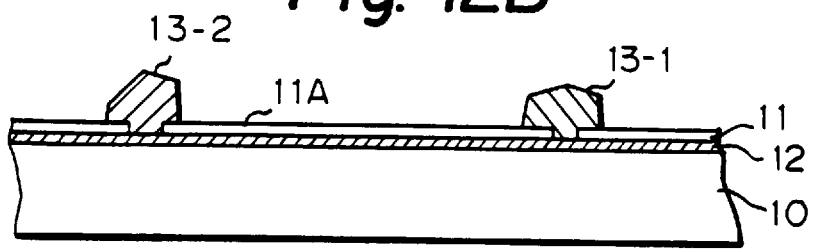
Figure 12C:
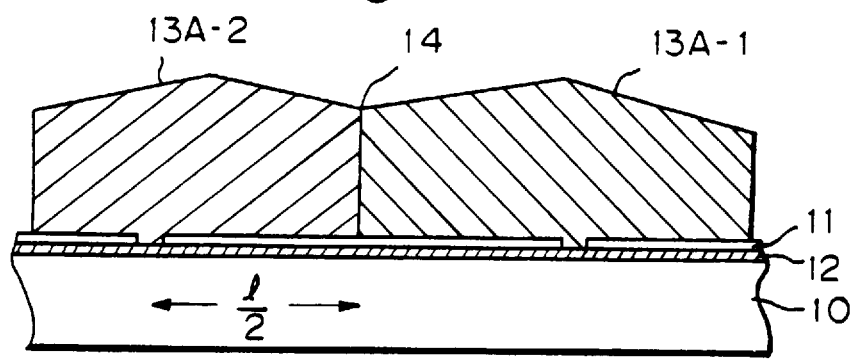
Figure 12D:
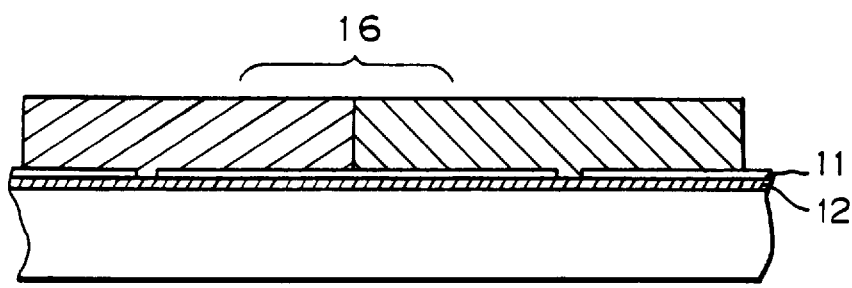

FIGS. 12(A)–12(D) are illustrations of the steps for forming crystal showing a fifth embodiment of the present invention. FIGS. 12(A)–12(C) are the same as FIGS. 7(A) –7(C). That is, a plurality (two in the Figure) of nucleation surfaces 12A-1, 12A-2 are formed with an interval of l, and single crystal grains 13-1, 13-2 subjected to over growth on the nucleation surfaces 12A-1, 12A-2 are formed. By permitting the single crystal grains 13-1, 13-2 to further grow to form single crystals 13A-1, 13A-2 a grain boundary 14 is formed approximately at the center between the nonnucleation surfaces ($S_{NDS}$) 11A, and by flattening the surface of single crystal 13A-1, 13A-2 a polycrystalline layer 16 with regular grain sizes which are approximately equal to l as shown in FIG. 12(D) can be obtained.

Since the grain size of the polycrystalline layer 16 is determined by the interval l between the nucleation surfaces ($S_{NDL}$) 12A-1, 12A-2, it becomes possible to control the grain size of the polycrystal. In the prior art, the grain size of a polycrystal was changed by a plural number of factors such as the formation method, formation temperature, etc., and also when preparing a polycrystal with large grain size, it had a grain size distribution with a considerable width. However, according to the present invention, the grain size and grain size distribution can be determined with good controllability by the interval l between the nucleation surfaces ($S_{NDL}$) 12A-1, 12A-2.

Of course, as shown in FIG. 6, polycrystal layer 21 may be formed as above by forming a thin film having nonnucleation surface ($S_{NDS}$) 5A with small nucleation density (ND) on a desired substrate 9 and plural nucleation surfaces ($S_{NDL}$) 9A with greater nucleation density (ND) at desired positions and intervals. In this case, as already mentioned, the substrate material and structure are not limited provided that the nucleation density difference ($\Delta ND$) is taken into consideration but the polycrystal layer can be formed by controlling the grain size and the grain size distribution.

Next, the specific method for forming a single crystal layer or a polycrystal layer in the above respective embodiments is described in more detail by referring primarily to the third embodiment shown in FIG. 7.

By thermal oxidation of a Si single crystal wafer to form a $SiO_2$ layer on the surface and subsequent thin film formation of $Si_3N_4$ or polycrystalline Si layer to a desired thickness by the reduced pressure chemical vapor deposition method, a surface with a large nucleation density (ND) is obtained. Of course, a quartz substrate which is a material with small nucleation density (ND) can be also used as a base substrate 10. Alternative a surface with a large nucleation density (ND) may be provided by forming a thin film 12 of $Si_3N_4$ or polycrystalline Si layer on the surface of any desired base substrate such as metal, semiconductor, magnetic material, piezoelectric material, insulator, etc., by use of the sputtering method, the CVD method, the vacuum vapor deposition method, etc. Also, as the material for formation of the thin film 12 partially providing nucleation surfaces ($S_{NDL}$), $SiO_2$ is desirable, but $SiN_x$ (0<x<4/3) with the value of x being varied may be also employed.

On the above thin film 12 thus formed on the substrate 10 is deposited a thin film 11 of $SiO_2$ or $SiO_Y$ (0<Y<2) according to the reduced pressure chemical vapor deposition method. Subsequently the above thin film 11 is subjected to patterning according to conventional lithographic technique or lithographic technique by use of X-ray, electron beam or ion beam to selectively expose the surface of the thin film 12, whereby nucleation surfaces ($S_{NDL}$) 12A-1, 12A-2 having fine area of preferably 10 μm or less, more preferably several microns or less, optimally about 1 μm or less, are obtained.

Subsequently, by use of $SiH_2Cl_2$, $SiCl_4$, $SiHCl_3$, $SiF_4$ or $SiH_4$ or a gas mixture of these, optionally mixed with HCl, $H_2$ or a gas mixture of these, Si single crystal is selectively grown on the above nucleation surface ($S_{NDL}$) 12A-1, 12A-2.

The substrate temperature, pressure, etc., may be conveniently determined, but the substrate temperature may be preferably 700° to 1100° C., and the pressure may be preferebly about 100 Torr.

Within a time of about some 10 minutes, by selection of optimum growth conditions, grains 13-1, 13-2 of single crystals of Si grow on the nucleation surfaces ($S_{NDS}$) 12A-1, 12A-2 as the center, and grow to sizes of some 10 μm or more.

Subsequently, by the reactive ion etching (RIE) method utilizing the etching speed difference between Si and $SiO_2$, the surfaces of the single crystals 13A-1, 13A-2 are flattened by selective etching of only Si, whereby a polycrystalline silicon layer controlled in grain size can be formed. Further, by removing the grain boundary portion, island-shaped single crystalline silicon layers 15-1, 15-2 are formed (FIG. 7(D)). If unevenness on the surface of the single crystal grains 13A-1, 13A-2 are large, mechanical polishing may be conducted before etching. When electrical field effect transistors are formed according to conventional semiconductor device preparation technique on the single crystal silicon layers 15-1, 15-2 thus formed with a size of some 10 μm or more containing no grain boundary, characteristics not inferior to that formed on single silicon wafer are exhibited.

Also, mutual interference between the adjacent single crystal silicon layers can be prevented, if they are electrically separated by an electrical insulator such as $SiO_2$, even if a complementary type electrical field effect transistor (C-COM) may be constituted.

Also, since the thickness of the active layer of the device formed is thinner than the case when employing Si wafer, there is no erroneous actuation by the charges generated when radiation is irradiated. Further, due to lowering in unwanted capacity, speed-up of the device can be effected. Also, since any desired substrate can be used, a single crystal layer can be formed on a substrate of large area at lower cost than when employing Si wafer. Further, since a single crystal layer can be formed also on other semiconductors, piezoelectric materials, dielectric materials, etc., a multifunctional three-dimensional integrated circuit can be realized. Thus, the present invention exhibits a number of excellent effects.

(Composition of silicon nitride)

For obtaining sufficient nucleation density difference ($\Delta ND$) between the material ($M_S$) for formation of nonnucleation surface ($S_{NDS}$) and the material ($M_L$) for formation of nucleation surface ($S_{NDL}$) as described above, for polycrystalline silicon or $SiO_2$ as the material for formation of nonnucleation surface ($S_{NDS}$) to be used in combination, the material for formation of nucleation surface ($S_{NDL}$) is not limited to $Si_3N_4$, but silicon nitrides with various chemical composition ratios may be employed.

The chemical composition ratio of silicon nitride may be varied e.g. as follows.

In the plasma CVD method for forming silicon nitride film at low temperature by decomposition of $SiH_4$ gas and $NH_3$ gas in RF plasma, by varying the flow rate ratio of $SiH_4$ gas and $NH_3$ gas, the composition ratio of Si and N in the deposited silicon nitride film can be varied to a great extent.

Figure 13:
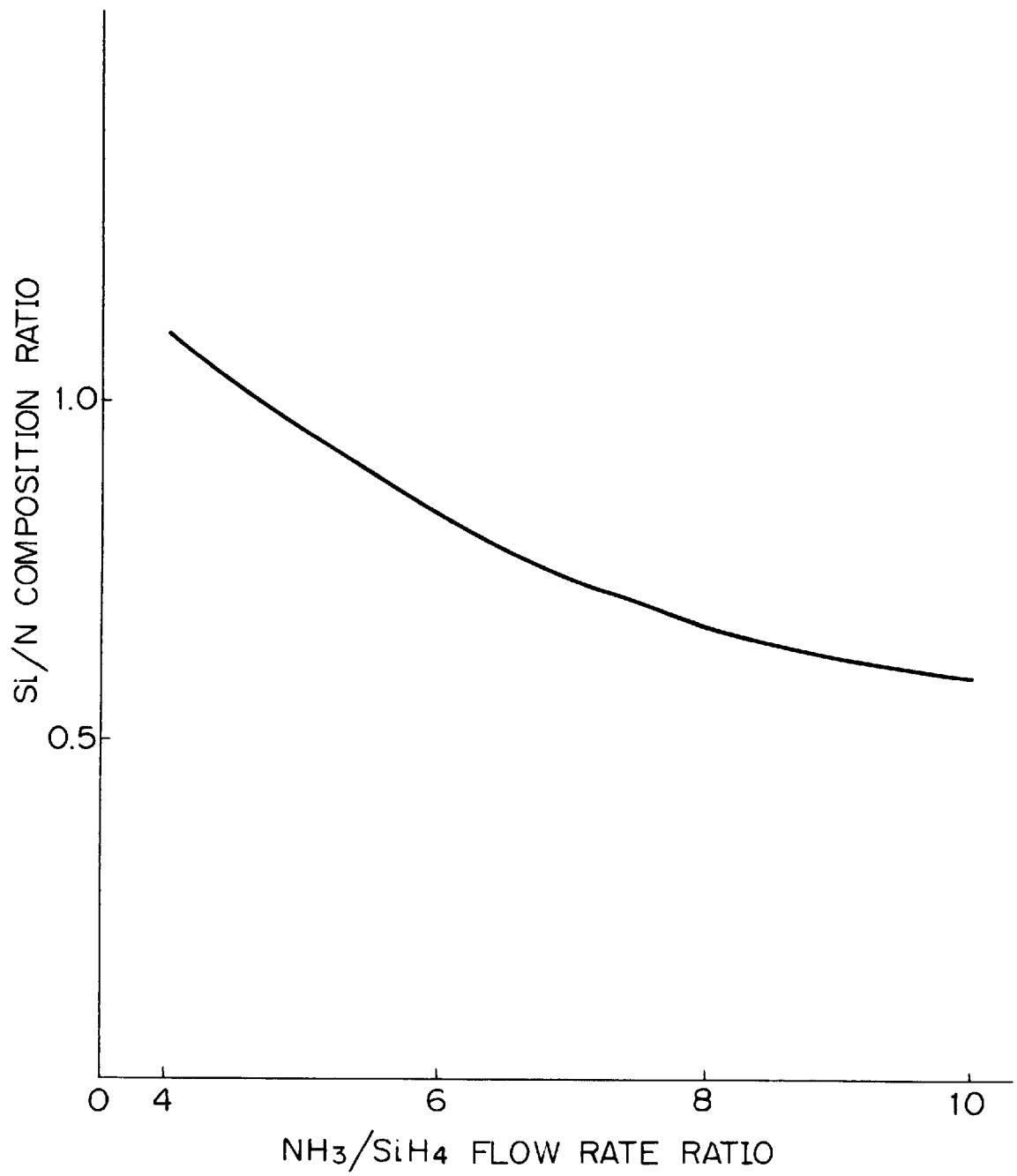
FIG. 13 is a graph showing the relationship between the flow rate of $SiH_4$ and $NH_3$ and the composition ratio of Si and N in the silicon nitride film formed.

FIG. 13 is a graph showing an example of the relationship between the flow rate ratio of $SiH_4$ and $NH_3$ and the composition ratio of Si and N in the silicon nitride film formed.

The deposition conditions at this time were RF output of 175 W, substrate temperature of 380° C. and the flow rate of $NH_3$ gas was varied with the $SiH_4$ gas flow rate being fixed at 300 cc/min. As shown in the same graph, by varying the gas flow rate ratio of $NH_3/SiH_4$ from 4 to 10, the Si/N ratio in the silicon nitride film was found to be varied from 1.1 to 0.58 according to Auger's electron spectrophotometry.

On the other hand, the composition of the silicon nitride film formed according to the reduced pressure CVD method by introducing $SiH_2Cl_2$ gas and $NH_3$ gas under the conditions of a reduced pressure of 0.3 Torr and a temperature of about 800° C. was found to be $Si_3N_4$ (Si/N=0.75) which is approximately the stoichiometric ratio.

Also, the silicon nitride film formed by heat treatment at about 1200° C. in ammonia or $N_2$ (hot nitrification method) can be obtained with a composition further approximate to the stoichiometric ratio, since the formation method is performed under thermal equilibrium.

By use of silicon nitrides formed by the various methods as described above as the material for forming nucleation surface ($S_{NDL}$) with higher nucleation density than $SiO_2$, the above nucleus of Si can be grown on the nucleation surface ($S_{NDL}$) comprising silicon nitride to form Si single crystal based on the nucleation density ($\Delta ND$) corresponding to the chemical composition ratio of silicon nitride.

Figure 14:
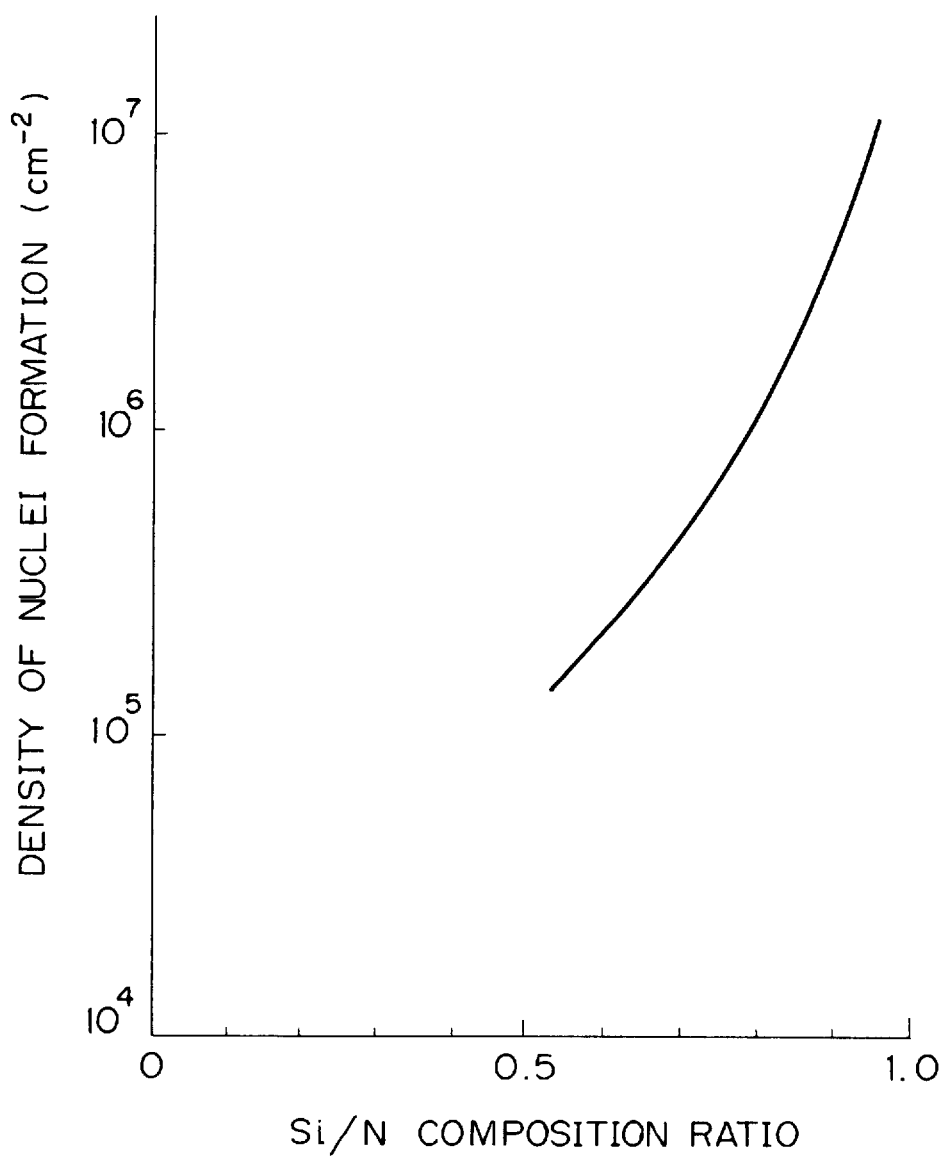
FIG. 14 is a graph showing the relationship between Si/N composition ratio and nucleation density.

FIG. 14 is a graph showing the relationship between Si/N composition ratio and nucleation density ($\Delta ND$). As shown in the same graph, by varying the chemical composition ratio of the silicon nitride film, the nucleation density of the Si single crystal nucleus formed thereon changes to a great extent. The nucleation conditions in the graph shown in FIG. 14 correspond to the case when Si single crystal nucleus was formed by reacting $SiCl_4$ gas reduced to 175 Torr with $H_2$ at 1000° C. Of course, another graph will be obtained if nucleation conditions such as gas species, pressure, temperature, etc., are changed.

The phenomenon that the nucleation density thus changes according to the chemical composition ratio of silicon nitride affects the size (area) of the nucleation surface ($S_{NDL}$) when employing silicon nitride as the material for forming the nucleation surface ($S_{NDL}$) which is formed sufficiently finely to the extent that a single nucleus may be grown. That is, when employing silicon nitride having a composition with great nucleation density (ND) only a single crystal can be formed on the nucleation surface ($S_{NDL}$) by forming the nucleation surface ($S_{NDL}$) extremely finely as compared with the silicon nitride with relatively smaller nucleation density (ND). Such a point is applicable as a similar tendency for other materials for forming nucleation surface ($S_{NDL}$). Accordingly, in the present invention, for accomplishing its objects effectively, it is desirable to select a nucleation density (ND) and a size of nucleation surface ($S_{NDL}$) formed of silicon nitride, etc., capable of forming only a single crystal suitably as desired. For example, under the nucleation condition for obtaining a nucleation density (ND) of about $10^5$ cm$^{-2}$, it is possible to form selectively only a single nucleus, if the size of the nucleation surface ($S_{NDL}$) comprising silicon nitride is about 4 $\mu$m or less. The Si/N ratio in that case is about 0.5.

Formation of nucleation surface ($S_{NDL}$) by ion injection.

As another method for realizing nucleation density difference ($\Delta ND$) when forming Si single crystal nucleus, ion injection of N, P, B, F, Ar, He, C, As, Ga, Ge, etc., may be effected locally onto the single crystal Si surface of the above substrate provided at desired positions and intervals with $SiO_2$ thin layer which is a material for forming non-nucleation surface ($S_{NDS}$) with smaller nucleation density thus resulting in partial exposure of the single crystal surface to form a modified region, and utilize this modified region as the nucleation surface ($S_{NDL}$) with greater nucleation density (ND).

For example, the $SiO_2$ layer surface given on the single crystal Si substrate is covered with a photo-resist layer and the desired portions are exposed, developed and dissolved to have the surface of the single crystal Si substrate exposed.

Subsequently, while the remaining photoresist layer is left as it is, by use of $NH_3$ gas as the source gas, N ions are implanted onto the single crystal Si layer surface portion exposed at 15 keV at a density of $1\times10^{16}$–$\times10^{18}$ cm$^{-2}$. The projected flying distance in this case is 120 Å, and the N concentration on the exposed surface of single crystal Si layer reaches about $10^{22}$ cm$^{-3}$. The modified region made excessively enriched in N by injection of N ions is amorphous.

For formation of a modified region, ion injection can be effected with the use of a resist as the mask, but it is also possible to inject a narrowed N ion beam selectively at an exposed single crystal Si portion of the layer surface without use of a resist mark by use of converged ion beam technique.

After having thus effected N ion injection, by peeling of the resist on the remaining portion, N-excessive modified region is formed in the single crystal Si layer surface at a desired position with a desired size. On the modified region of the substrate for crystal growth, Si single crystal is permitted to grow in vapor phase.

Method for formation of Si single crystal nucleus other than CVD.

For growth of single crystal by selective nucleation of Si, not only the CVD method, but also the method by evaporation of Si into vacuum (<$10^{-6}$ Torr) with an electron gun and deposition on a heated substrate may be used. Particularly, in the MBE (Molecular Beam Epitaxy) method which performs vapor deposition in ultra-high vacuum (<$10^{-9}$ Torr), it has been known that Si begins to react with $SiO_2$ at a substrate temperature of 900° C. or higher, whereby no nucleation of Si occurs on $SiO_2$ at all (T. Yonehara, S. Yoshioka and S. Miyazawa, Journal of Applied Physics 53, 10, p. 6839, 1983).

By utilizing this phenomenon, single crystal nuclei of Si can be formed with perfect selectivity on the fine silicon nitride regions permitted to exist in spots on the $SiO_2$ thin film by giving concavities and exposing it, and single crystal Si can be grown from the nuclei. The single crystal growth conditions as preferable example at this time may be, for example, a vacuum degree of $10^{-8}$ Torr or lower, Si beam intensity of $9.7\times10^{14}$ atoms/cm$^2$·sec, and a substrate temperature of 900° C.–1000° C.

In this case, through the reaction $SiO_2+Si\rightarrow 2SiO\uparrow$, a reaction product of SiO with a remarkably high vapor pressure is formed, and etching of $SiO_2$ itself with Si through this evaporation occurs.

In contrast, no such etching phenomenon as mentioned above occurs on silicon nitride thin film, but nucleation of Si single crystal and growth of single crystal occur.

Accordingly, as the material for forming nucleation surface ($S_{NDL}$) with high nucleation density (ND), tantalum oxide ($Ta_2O_5$), silicon nitride oxide (SiON), etc., can be also used other than silicon nitride to obtain the same effect. That is, by forming the above nucleation surface ($S_{NDL}$) with these materials in fine areas, single crystals of Si can be permitted to grow similarly.

Crystal growth of material other than Si (1) As the crystalline material other than Si, the case of diamond is shown as an Example. As already mentioned, it has been desired to apply a diamond thin film as the semiconductor for electronic devices, however, it has been impossible in the prior art to grow a diamond single crystal on a material other than the diamond substrate.

However, according to the crystal growth method according to the present invention, a diamond single crystal can be easily grown on a material other than diamond substrate. Here, explanation is made about an example of forming a single crystal of diamond by utilizing the fact that no single crystal nucleus of diamond grows on the surface of a metal such as Fe or Co.

First, on a desired base substrate, a thin film of a metal such as Cu, W, Ta, Mo, Au, Ti, Al, Ni, etc., is deposited according to the vacuum vapor deposition method, or a semiconductor material thin film such as of Si, Ge, GaAs, InP, SiC, etc., according to the CVD method or the vacuum vapor deposition method. These thin films ($F_L$) form nucleation surfaces ($S_{NDL}$) having a large nucleation density (ND) mentioned in this specification. Subsequently, on the film ($F_L$), a metal thin film of Fe or Co is formed by the vacuum vapor deposition method. This metal thin film has a polycrystalline structure. These metal films ($F_S$) have a sufficient smaller nucleation density as compared with the above thin film ($F_L$). Subsequently, the above thin film ($F_S$) is subjected to patterning so as to expose the above film ($F_L$) to a size of several micrometer to form a nucleation surface ($S_{NDL}$) with a sufficiently minute area.

Thus, single crystal diamond is crystallized on the nucleation surface under the following conditions.

As the method for crystallization of diamond, there may be employed the CVD method according to the microwave plasma CVD method, the hot filament method, etc. As the starting gases, for example, there may be employed gas mixtures of methane ($CH_4$) and hydrogen (1–10%), or hydrocarbons having alcoholic OH groups, specifically methyl alcohol $CH_3OH$, ethyl alcohol $C_2H_5OH$, tert-butyl alcohol $(CH_3)_3OH$, isopropyl alcohol $(CH_3)_2)CHOH$, diethyl ether $C_2H_5OC_2H5$, etc., by bubbling these liquids with hydrogen gas.

In the case of the plasma CVD method, it can be practiced, for example, under the conditions of a microwave output of 200 to 350 W, a substrate temperature of 500° to 1000° C. and a reduced pressure of 1 to 400 Torr.

In the case of the CVD method by use of the hot filament method, it can be practiced, for example, under the conditions of a filament temperature of about 1500° to 2000° C. and a filament-substrate distance of 0.5 to 10 mm.

As the result, no nucleation of diamond occurs at all on the metal thin film ($F_S$) of Fe or Co, but only a single diamond single crystal nucleus is formed on the nucleation surface ($S_{NDL}$) with higher nucleation density (ND) minutely formed by exposing the thin film ($F_L$) out of the thin film ($F_S$), and thereafter diamond grains of single crystals grow to the sizes of some 10 $\mu$m to some 100 $\mu$m with the single diamond nuclei as their centers. In these diamond grains, there may sometimes exist internally the twin crystal grain boundaries without unpaired electrons depending on the crystal forming conditions, but there exists no grain boundary containing much unpaired electrons as found in the so called polycrystalline structure. This is because growth of a diamond single crystal from a single nucleus formed on the nucleation surface ($S_{NDL}$) is not inhibited due to absence of formation of diamond nucleus on the nonnucleation surface ($S_{NDS}$) formed of a material such as Fe or Co with lower nucleation density.

Figure 15:
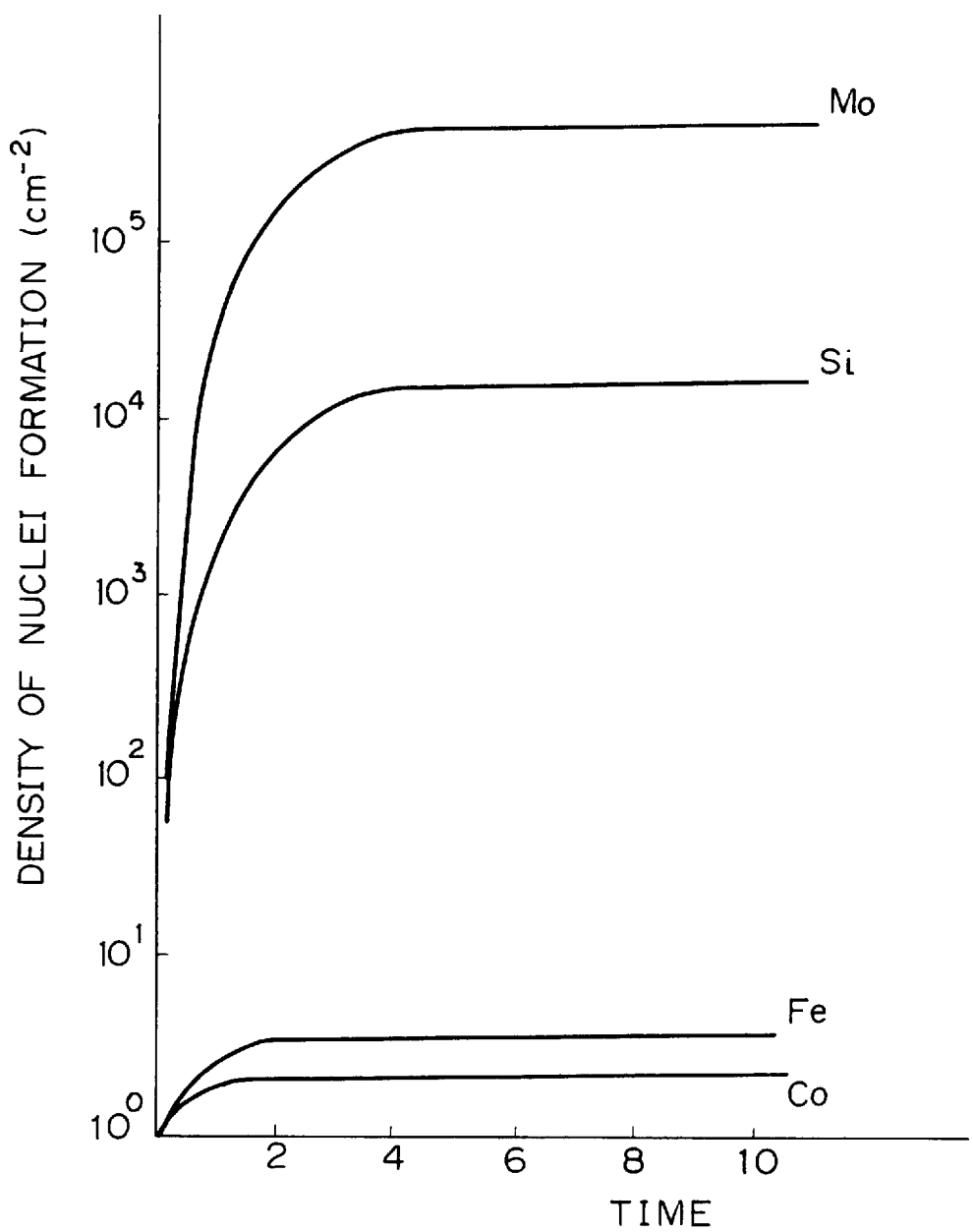
FIG. 15 is a graph showing the time dependency of nucleation density of diamond nuclei on Fe, Co, Si and Mo.

FIG. 15 is a graph showing the time dependency of nucleation density of the diamond on the surface of Fe, Co, Si, Mo.

As shown in this graph, it is possible to take sufficiently a difference in nucleation density of diamond on the surface of a metal of Fe, Co and on the surface of Si, Mo. This point is the same as in the case of nucleation density of Si on the surface of $Si_3N_4$ and on the surface of $SiO_2$ shown in FIG. 3.

Thus, by forming a layer for formation nucleation surface ($S_{NDL}$) with higher nucleation density (ND) on the base substrate of any desired material other than diamond substrate, and thereon forming a thin film giving nonnucleation surface ($S_{NDS}$) with lower nucleation density (ND) so as to expose the surface of the above thin film ($F_L$) selectively at a sufficiently minute area, diamond single crystal can be formed with ease using the thus obtained substrate for crystal formation. Of course, as already mentioned, it is possible to form a diamond thin film of a polycrystalline structure with controlled grain size by arranging nucleation surfaces ($S_{NDL}$) having fine areas at desired intervals.

Also, according to the present invention, as the base substrate, it may in principle be a substrate of the material capable of forming a thin film ($F_L$) giving the above nucleation surface ($S_{NDL}$), and therefore the selection scope can be broadened to a great extent to accomplish low cost and enlargement of area with ease.

(2) Growth of tungsten single crystal

Tungsten has been known to effect no nucleation on the surface of $SiO_2$ layer, but to be deposited as a polycrystalline film on Si, $WSi_2$, PtSi, Al, etc.

First, on a suitable substrate, a thin film ($F_L$) of Si, $WSi_2$, PtSi or Al is deposited by vacuum vapor deposition. These films provide surfaces forming nucleation surface ($S_{NDL}$). Next, on the thin film ($F_L$) comprising the above material, a thin film ($F_S$) comprising a material with small nucleation density (ND) such as $SiO_2$, etc., is formed according to the heat oxidation treatment, hot CVD, PCVD, sputtering, etc. Then, the substrate subjected to patterning so as to expose the above thin film ($F_S$) to a size of several $\mu$m or less by photolithography to form a desired number of nucleation surface ($S_{NDL}$).

Subsequently, the substrate for crystal formation prepared as above is placed in, for example, a reaction furnace heated to 250°–500° C., and a gas mixture of $WF_6$ gas and hydrogen gas is permitted to flow under a reduced pressure of about 0.1 to 10 Torr, at the respective flow rate of 75 cc/min and 10 cc/min.

By doing so, tungsten is formed as represented by the reaction scheme $WF_6 + 3H_2 \rightarrow W + 6HF$. In this case, the reactivity of tungsten with $SiO_2$ is extremely low to give no firm bonding, and therefore no nucleation occurs on the surface of the thin film ($F_S$) of e.g. $SiO_2$ and hence no deposition is effected.

In contract, on the above nucleation surface ($S_{NDL}$) formed of a thin film ($F_L$) of Si, $WSi_2$, PtSi, Al, etc., single crystal nuclei of tungsten are formed single crystal nuclei of tungsten singly, because nucleation surfaces ($S_{NDL}$) are formed minutely. And, the single crystal of tungsten continues to grow and also grows as such single crystal also in the lateral direction on the thin film ($F_S$). This is because nonnucleus growth of tungsten occurs on the thin film ($F_S$), whereby no polycrystal is formed by interference of single crystal growth.

The combination of the nonnucleation surface ($S_{NDS}$) forming material, nucleation surface ($S_{NDL}$) forming material and crystal forming material as described above is not limited to those shown in the above embodiments, but it may be clearly a combination of materials having sufficient nucleation density difference ($\Delta$ND). Accordingly, also in the case of a compound semiconductor capable of selective nucleation such as GaAs, InP, etc., a single crystal, a group of single crystals or a polycrystal controlled in grain size and grain size distribution can be formed according to the present invention.

EXAMPLE 1

A 5 inch Si single crystal wafer was set in a reduced pressure chemical vapor deposition device and $Si_3N_4$ layer was formed to a thickness of 300 Å (formation of nonnucleation surface ($S_{NDS}$)) according to the hot CVD method under the deposition conditions as follows.

| Pressure | 0.3 Torr |
| --- | --- |
| Gases used | $SiH_2Cl_2$ + $NH_3$ gas mixture |
| Flow rate ratio | $NH_3/SiH_2Cl_2$ = 7 |
| Temperature | 820° C. |

Next, the above Si single crystal wafer having $Si_3N_4$ layer formed thereon was set in a reduced pressure chemical vapor deposition device, and a $SiO_2$ layer was formed to a thickness of 500 Å on the $Si_3N_4$ layer according to the hot CVD method under the following deposition conditions.

| Pressure | 1.0 Torr |
| --- | --- |
| Gases used | $SiH_4$ + $N_2O$ |
| Flow rate ratio | $SiH_4/N_2O$ = 5 |
| Substrate temperature | 700° C. |

Next, the above $SiO_2$ layer was subjected to patterning according to X-ray lithographic technique to form $Si_3N_3$ minute regions for nucleation surfaces ($S_{NDL}$) of $Si_3N_4$ exposed thereat in a matrix arrangement of 50×100 with sizes of 1 μm and 150 μm pitch.

On the Si single crystal wafer having thus provided nonnucleation surface comprising $SiO_2$ ($S_{NDS}$) and nucleation surfaces ($S_{NDL}$) of 50×100 of $Si_3N_4$ exposed thereat, Si single crystals were grown according to the hot CVD method under the Si single crystal growth conditions shown below.

| Pressure | 150 Torr |
| --- | --- |
| Gases used | $SiH_2Cl_2$ |
| Flow rate | 1.2 liter/min |
| Temperature | 1030° C. |
| Crystal growth time | 40 min |

The Si single crystal wafer applied with the crystal preparation treatment was taken out from the device, and the crystal was evaluated by observation with an electron microscope and X-ray diffraction. As the result, it was found that 50×100 Si single crystals with grain size of 80 μm and substantially no grain size distribution were formed with the above region of exposed $Si_3N_4$, as the center.

All of these Si single crystals were shown to have single crystal properties of extremely good quality.

EXAMPLE 2

Under the same conditions as in Example 1 except for taking sufficient time for growth of Si single crystals, a Si polycrystalline layer comprising the state in which adjacent Si single crystals contact each other as shown in FIG. 12(D) was formed. On the surface of the polycrystalline layer, smoothing treatment was applied according to the selective etching method as conventionally practiced in the field of semiconductors.

By use of the Si polycrystalline layer having thus smoothened surface, P-MOS transistor was prepared according to the method conventionally used in the field of semiconductors and actuation characteristics were measured. As the result, it was found to be by far superior to the case of P-MOS transistor formed by use of the Si polycrystalline layer obtained according to the prior art method.

EXAMPLE 3

When Si single crystal group as shown in FIG. 7(D) was prepared under the growth conditions of substrate for formation of crystal and the crystal growth conditions shown below and otherwise similar to Example 1, and evaluated in the same manner as in Example 1, the same results as in Example 1 were obtained.

[Substrate growth conditions]

| Substrate | Si Polycrystalline substrate having $Si_3N_4$ layer to a thickness of 300 Å provided according to the hot CVD method |
| --- | --- |
| Pressure | 0.4 Torr |
| Gases used | $SiH_2Cl_2$ + $NH_3$ gas mixture |
| Flow rate ratio | $NH_3/SiH_2Cl_2$ = 7 |
| Temperature | 850° C. |

Minute region of exposed silicon nitride [nucleation surface ($S_{NDL}$)]

0.5 μm size, 200 μm pitch, 100×100 matrix arrangement [crystal growth conditions]

| Pressure | 140 Torr |
| --- | --- |
| Gases used | $SiHCl_3$ |
| Flow rate | 1.5 liter/min |
| Temperature | 1100° C. |
| Crystal growth time | 60 min |

[Si single crystal which is grown]
Grain size 170 μm
Substantially no grain size distribution

EXAMPLE 4

A single crystal of diamond was prepared as described below.

A quartz base substrate was prepared, and an Si thin film with a thickness of 250 Å was provided on its surface according to the sputtering method. Next, on the Si thin film, a Co thin film was formed to a thickness of 500 Å according to the vacuum vapor deposition method by resistor heating.

Subsequently the Co thin film was subjected to patterning treatment according to the photolithographic method to form a nucleation surface ($S_{NDL}$) form of thin film minute region in shape of 100×100 matrix with 1 μm size and 100 μm pitch (formation of diamond single crystal substrate).

By use of the thus obtained substrate for growth of single crystals, single crystals of diamond were grown according to the microwave plasma CVD method under the following conditions.

| Microwave output | 300 W |
| --- | --- |
| Substrate temperature | 950° C. |
| Pressure | 30 Torr |
| Starting material used | $CH_3OH$ ($H_2$ bubbling) |
| Flow rate | 0.5 liter/min |

Single crystal of diamond thus obtained had grain size of 60 μm substantially without grain size distribution, having extremely good electrical insulation and excellent thermal conductivity.

EXAMPLE 5

Single crystals of tungsten were grown as described below.

A Si single crystal wafer was prepared, and an Al thin film with a thickness of 800 Å was provided on its surface according to the vacuum vapor deposition method. Next, on the Al thin film, by use of (SiH$_4$+O$_2$) gas mixture diluted with He, a SiO$_2$ thin film was formed to a thickness of 500 Å according to the plasma CVD method at a substrate temperature of 300° C.

This SiO$_2$ thin film was then subjected to patterning by photolithography into a matrix of 50×50 with 5 μm size and 100 μm pitch [preparation of nucleation surface (S$_{NDL}$)].

On the thus obtained substrate for preparation of tungsten single crystals, single crystals of tungsten were prepared according to the hot CVD method under the following conditions. As a result, the grain size was 70 μm substantially without grain size distribution. All of the tungsten crystals formed on the substrate exhibited excellent single crystal properties.

| | |
|---|---|
| Substrate temperature | 300° C. |
| Pressure | 1 Torr |
| Gases used | WF$_6$ + H$_2$ gas mixture |
| WF$_6$ flow rate | 75 cc/min |
| H$_2$ flow rate | 10 cc/min |
| Crystal preparation time | 100 min |

As described in detail above, the crystal and the method for formation thereof according to the present invention, by forming sufficiently finely the nucleation surface (S$_{NDL}$) of a material with sufficiently greater nucleation density (ND) than the material for formation of nonnucleation surface (S$_{NDS}$) so that only a single nucleus may grow, permit single crystals to grow selectively at the sites where the fine nucleation surfaces (S$_{ND}$) exist, whereby crystals such as a single crystal with a necessary size, a plurality of island-shaped single crystals, a polycrystal controlled in grain size and grain size distribution, etc., can be formed easily on a base substrate of any desired material. Besides, no special new preparation device is required, but it can be formed by use of a device conventionally used in semiconductor process.

Also, the crystal according to the present invention is not limited to the materials of base substrates as in the prior art, and therefore threedimensional integration, enlargement of area and reduction in cost can be easily accomplished. For example, since a single crystal or polycrystal of silicon which is the main material of semiconductor devices can be easily formed on an amorphous insulating material, multi-layer of devices with excellent electrical properties can be accomplished to realize a multi-functional integrated circuit not found in the prior art. More specifically, it becomes possible to integrate or combine an optical device, a surface acoustic device, a piezoelectric device, etc., with the surrounding circuit IC of the respective devices, etc. Also, by use of a cheap glass or ceramic, etc., as the base material, application for a large area electronic device such as a large scale flat panel display in which driving circuits are integrated in a sheet of glass, etc., is rendered possible.

Further, the present invention, by forming the above nucleation surfaces (S$_{NDL}$) with desired sizes and desired distances on the nonnucleation surface (S$_{NDS}$), can form single crystals with necessary sizes on a plural number of sites, and therefore the formation steps can be simplified to a great extent and also the formation time can be shortened as compared with the melting solidification method in which single crystals are formed by irradiation of laser or electron beam.

Also, by controlling the intervals of the nucleation surfaces (S$_{NDL}$) formed on the above nonnucleation surface (S$_{NDS}$), a polycrystal controlled in grain size by the intervals can be formed. In this polycrystal formation method, controllability of grain size and grain size distribution is good and the formation time can be also shortened to a great extent as compared with the method of the prior art for forming a polycrystal with a large grain size according to the above melting solidification method.

We claim:

1. A method for producing a crystal article having a crystal portion constituted of a plurality of single-crystals formed on a substrate having a plurality of nucleation surfaces, said nucleation surfaces constituting a first amorphous material which are exposed from a non-nucleation surface, said non-nucleation surface being a second amorphous material; said single-crystals corresponding in shape to each of said exposed nucleation surfaces and overgrown on said non-nucleation surface, which method comprises:
   (a) providing a substrate having said nucleation surfaces comprising said first amorphous material;
   (b) forming a layer having said non-nucleation surface comprising said second amorphous material on said nucleation surfaces of said substrate;
   (c) partly removing said layer to expose said nucleation surfaces;
   said exposed nucleation surfaces being arranged in a plural number as regularly sectionalized within said non-nucleation surface;
   the nucleation density of the material constituting said single-crystal on said exposed nucleation surface being sufficiently larger than the nucleation density of the material constituting said single-crystal on said non-nucleation surface so as to form a nucleus from which said single-crystal is grown only on said exposed nucleation surface; and
   each of said exposed nucleation surfaces having an area of 10 mm or less in diameter so as to form a nucleus from which said single-crystal is grown only on said exposed nucleation surface; and
   (d) applying vapor deposition to form said nucleus and to grow said single-crystal from said nucleus.

2. A method for producing a crystal article according to claim 1, wherein said nucleation surfaces are constituted by a material different in composition from said non-nucleation surface.

3. A method according to claim 1, wherein said single-crystals are silicon single-crystals.

4. A method according to claim 1, wherein said non-nucleation surface is constituted of an amorphous oxide.

5. A method according to claim 1, wherein said nucleation surfaces are constituted of silicon nitride.

6. A method according to claim 1, wherein said nucleation surfaces are constituted of Si$_3$N$_4$.

7. A method according to claim 1, wherein said nucleation surfaces are constituted of silicon nitride, and said non-nucleation surface is constituted of amorphous silicon oxide.

8. A method according to claim 1, wherein said nucleation surfaces are constituted of tantalum oxide.

9. A method according to claim 1, wherein said nucleation surfaces are constituted of silicon oxynitride.

10. A method according to claim 1, wherein said non-nucleation surface is constituted of SiO$_2$.

11. A method according to claim 2, wherein said single-crystals are silicon single-crystals and said non-nucleation surface is constituted of SiO$_2$.

12. A method for producing a crystal article having a crystal portion constituted of a plurality of single-crystals formed on a substrate having a plurality of nucleation surfaces of a metallic material exposed from a non-nucleation surface of a second material, said single-crystals corresponding in shape to said nucleation surfaces and overgrown on said non-nucleation surface, which method comprises:

(a) providing a substrate having said nucleation surfaces comprising said metallic material;

(b) forming a layer having said non-nucleation surface comprising said second material on said nucleation surfaces of said substrate;

(c) partly removing said layer to expose said nucleation surfaces;

said exposed nucleation surfaces being arranged in a plural number as regularly sectionalized within said non-nucleation surface;

the nucleation density of the material constituting said single-crystal on said exposed nucleation surface being sufficiently larger than the nucleation density of the material constituting said single-crystal on said non-nucleation surface so as to form a nucleus from which said single-crystal is grown only on said exposed nucleation surface; and each of said exposed nucleation surfaces having an area of 10 mm or less in diameter so as to form a nucleus from which said single-crystal is grown only on said exposed nucleation surface; and (d) applying vapor deposition to form said nucleus and to grow said single-crystal from said nucleus;

wherein said single-crystal is comprised of a material other than the material constituting said exposed nucleation surface.

13. A method according to claim 12, wherein said single-crystals are constituted of a material selected from diamond and tungsten.

14. A method according to claim 12, wherein said single-crystals are diamond single-crystals and said non-nucleation surface is constituted of Fe or Co.

15. A method according to claim 12, wherein said single-crystals are tungsten single-crystals and said non-nucleation surface is constituted of a glass primarily composed of $SiO_2$.

16. A method according to claim 15, wherein said non-nucleation surface is constituted of $SiO_2$.

17. A method according to claim 12, wherein said single-crystals are tungsten single-crystals and said non-nucleation surface is constituted of amorphous silicon oxide.

18. A method according to claim 12, wherein said single-crystals are tungsten single-crystals and said nucleation surfaces are constituted of a material selected from $WSi_2$, and PtSi and Al.

19. A method according to claim 12, wherein said single-crystals are diamond single-crystals and said nucleation surfaces are constituted of a material selected from Cu, W, Ta, Mo, Au, Ti, Al and Ni.

20. A method for producing a crystal article having a crystal portion constituted of a plurality of single-crystals formed on a substrate having a plurality of nucleation surfaces of a first amorphous material exposed from a non-nucleation surface of a second amorphous material, said single-crystals corresponding in shape to each of said nucleation surfaces and overgrown on said non-nucleation surface, which method comprises:

(a) providing a substrate having said nucleation surfaces comprising said first amorphous material and formed by ion implantation;

(b) forming a layer having said non-nucleation surface comprising said second amorphous material on said nucleation surfaces of said substrate;

(c) partly removing said layer to expose said nucleation surfaces;

said exposed nucleation surfaces being arranged in a plural number as regularly sectionalized within said surface;

the nucleation density of the material constituting said single-crystal on said exposed nucleation surface being sufficiently larger than the nucleation density of the material constituting said single-crystal on said non-nucleation surface so as to form a nucleus from which said single-crystal is grown only on said exposed nucleation surface; and each of said exposed nucleation surfaces having an area of 10 mm or less in diameter so as to form a nucleus from which said single-crystal is grown only on said exposed nucleation surface; and (d) applying vapor deposition to form said nucleus and to grow said single-crystal from said nucleus.

21. A method according to claim 20, wherein said single-crystals are constituted of a material selected from silicon and diamond.

22. A method according to claim 20, wherein said single-crystals are silicon single-crystals and said nucleation surfaces are formed by ion implantation of a material selected from Si, N, P, B, F, Ar, He, C, As, Ga and Ge into $SiO_2$.

23. A method according to claim 20, wherein said single-crystals are diamond single-crystals and said nucleation surfaces are formed by ion implantation of a material selected from Si, Ge, Cu, W, Ta, Mo, Au, Ti, Al and Ni into Fe or Ni.

24. A method according to claim 1, 12 or 20, wherein growing said crystal is conducted according to the CVD method.

25. A method according to claim 1, 12 or 20, wherein the single-crystals grown from the respective nucleation surfaces are permitted to grow to such a size that they conduct between adjacent nucleation surfaces.

* * * * *